(12) United States Patent
Vaisman et al.

(10) Patent No.: US 11,324,111 B1
(45) Date of Patent: May 3, 2022

(54) APPARATUS FOR SHIELDING OF SURFACE-MOUNT DEVICES

(71) Applicant: Scientific Components Corporation, Brooklyn, NY (US)

(72) Inventors: Aaron Vaisman, New York, NY (US); Benjamin Kahtan, Brooklyn, NY (US); Behnam Tabrizi, Boston, MA (US); Himat Hayer, Merrick, NY (US)

(73) Assignee: Scientific Components Corporation, Brooklyn, NY (US)

( * ) Notice: Subject to any disclaimer, the term of this patent is extended or adjusted under 35 U.S.C. 154(b) by 0 days.

(21) Appl. No.: 17/072,871

(22) Filed: Oct. 16, 2020

Related U.S. Application Data

(60) Provisional application No. 62/916,941, filed on Oct. 18, 2019.

(51) Int. Cl.
*H05K 1/18* (2006.01)
*H05K 1/02* (2006.01)
*H05K 1/03* (2006.01)

(52) U.S. Cl.
CPC ......... *H05K 1/0233* (2013.01); *H05K 1/0306* (2013.01); *H05K 1/181* (2013.01)

(58) Field of Classification Search
CPC .... H05K 1/0233; H05K 1/0306; H05K 1/181; H05K 1/0215; H05K 1/0218; H05K 1/0231
USPC .......................................................... 361/818
See application file for complete search history.

(56) References Cited

U.S. PATENT DOCUMENTS

| 4,599,680 | A | * | 7/1986 | Gibson | ..................... | B64G 1/50 257/713 |
| 5,847,938 | A | * | 12/1998 | Gammon | ............... | H05K 9/003 361/816 |
| 9,513,675 | B2 | * | 12/2016 | Nicol | ................. | H05K 7/20336 |
| 2019/0239340 | A1 | * | 8/2019 | Trulli | ..................... | H01P 5/085 |

* cited by examiner

*Primary Examiner* — Binh B Tran
(74) *Attorney, Agent, or Firm* — Lawrence G. Fridman, Esq; Feigin & Fridman, LLC

(57) ABSTRACT

An apparatus for a shielding structure for surface-mount components and filters to increase the signal isolation from input signal port to output signal port. An LTCC filter device with an increased rejection of undesired frequencies in a stopband and minimal distortion or loss of desired signals in a passband.

20 Claims, 22 Drawing Sheets

APPARATUS FOR SHIELDING OF SURFACE-MOUNT DEVICES

CROSS-REFERENCE TO RELATED APPLICATIONS

This application claims the benefit of U.S. Ser. No. 62/916,941, filed on Oct. 18, 2019, which is incorporated in its entirety herein by reference.

FIELD OF THE INVENTION

The present invention relates generally to surface mount electronic devices, and in particular, to low temperature co-fired ceramic (LTCC) surface-mounted devices.

BACKGROUND OF THE INVENTION

Isolation of radio frequency, microwave, millimeter-wave signals and the like from the input port to the output port of a surface-mount electrical device or LTCC device is important to useful operation of the device and should be maximized. There remains a need for a device and technique to increase this signal isolation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
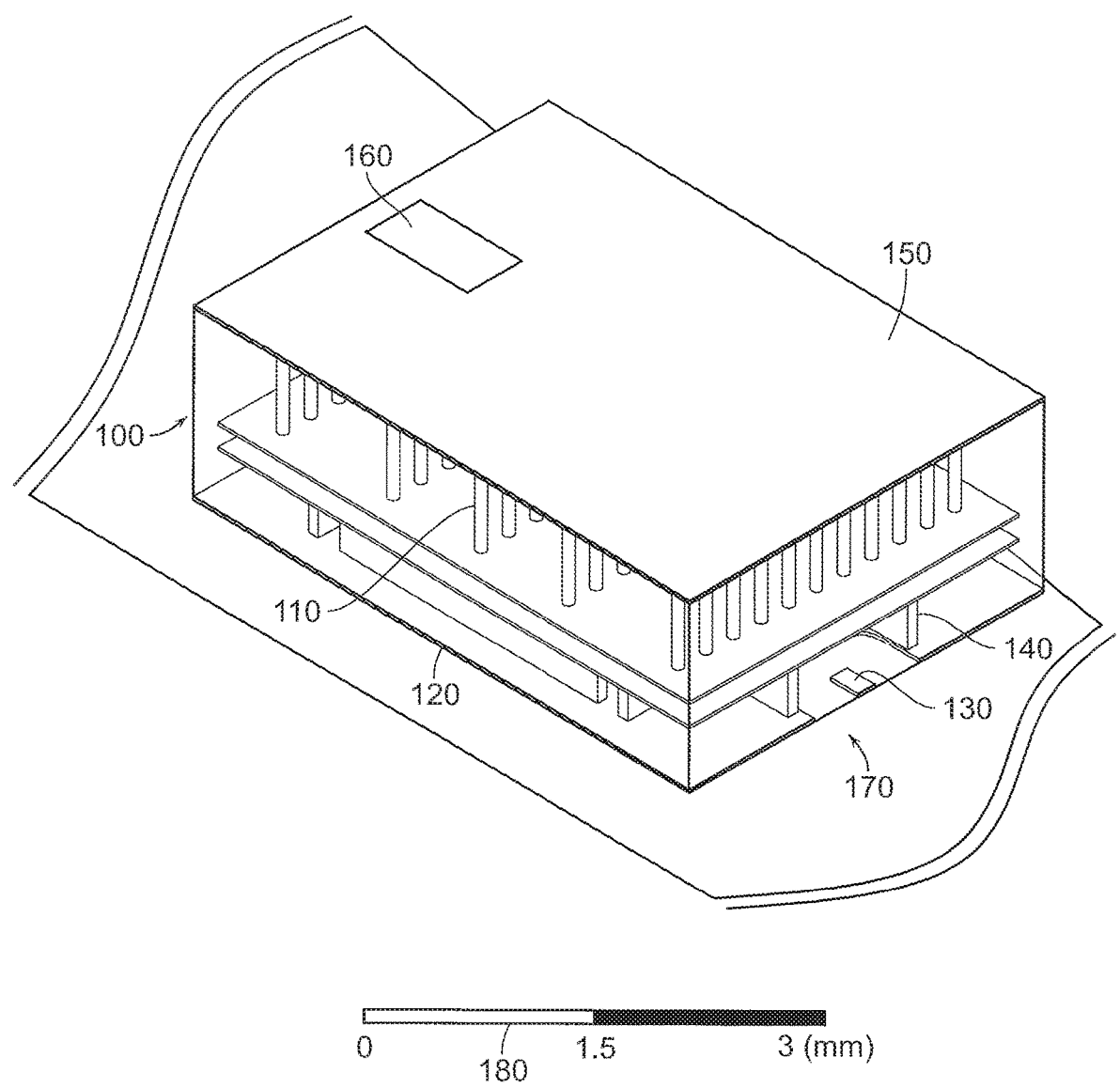
FIG. 1 depicts an exemplary diagram according to embodiments of the invention.

Embodiments of the invention are illustrated by way of example and not limitation in the figures of the accompanying drawings, in which like reference numerals indicate corresponding, analogous or similar elements. It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF EMBODIMENTS OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Embodiments of the invention may be used in a variety of applications. Some embodiments of the invention may be used in conjunction with various devices and systems, for example, low temperature co-fired ceramic (LTCC) devices, printed circuit board (PCB) manufacturing processes such as those for electronic circuits, electronic circuits, and electronic systems. Other embodiments may be used with substrates and substrate materials, lumped element electronic parts, distributed electronic parts and structures and other electronics manufacturing materials, for example epoxies, solders and other attachment materials.

Low-Temperature Co-Fired Ceramic (LTCC) may refer to materials and/or manufacturing processes by which electronic devices, including but not limited to, filters, couplers, transformers, and/or carrier boards, for example, for multi-component assemblies, may be constructed from sheets, e.g. tapes, tape layers, etc., of ceramic material that may feature, for example, embedded metallic vias and/or printed metallic conductors, which may be collated, singulated, and/or sintered, e.g. co-fired, into, for example, monolithic devices. Such devices may be devices constructed using such processes.

An embodiment of the invention may be comprised of a shielding structure surrounding a circuit, or one or more circuit elements or parts, constructed on, or part of, an LTCC substrate. The shielding structure may be external and/or may surround the circuit within and may be constructed of metal, or metal plated or metal finished supporting material and may have a continuous metallic circumference. A shielding structure may have a solid envelope shape, rectangular in nature, a shape of a rectangular prism, or any other suitable geometric shape. The metal may be continuous around an entire device, in three dimensions, with the exception of metallic relief where electronic signals, e.g. baseband, radio frequency (RF), microwave, millimeter-wave signals and/or bias signals, may transition into and/or out of an enclosed circuit. In some embodiments the metallic shield may not be continuous and may have discontinuities, apertures, etc. as may be necessary for certain electrical structures, manufacturing processes or other mechanical or process reasons. In some embodiments where there may be such physical discontinuities there may be electrical continuity at frequencies above zero hertz (Hz), for example by electrical signal coupling, capacitive coupling, electromagnetic field coupling, and the like. A metal may be any electrically conductive metal, for example silver, gold, aluminum, brass, steel, a ferrous material, e.g., ferrous steel, Kovar, etc., and/or any combination or alloy of such metals. Any material having electrically conductive properties, for example at least within a frequency band of operation, may be used.

A shielding structure may be manufactured or assembled coherently with an enclosed LTCC circuit and/or component. Alternately, a shielding structure may be added following manufacture of an LTCC circuit and/or component. A shielding structure may be added prior to or during a PCB assembly process.

An LTCC circuit and/or component enclosed by a shielding structure may have a grounding structure that may be compatible with a shielding enclosure. Grounding may be direct current (DC) electrical grounding or may be by electromagnetic grounding, e.g. as with a Faraday enclosure effect, a coupling effect, or other electrical operable connection effect. A shielding structure attached to an enclosed LTCC circuit, LTCC structure and/or device may form an electromagnetic shielding enclosure or other electrical grounding. A grounded shielding structure may be self-contained or may be attached to a circuit ground on a PCB. A shielding structure that may be electrically and/or mechanically connected to a circuit ground on a PCB may electrically share the same electrical ground properties of the circuit on the PCB. An LTCC component may have features of a grounding structure that may be compatible with an external shielding.

A shielding structure may have elements and/or design features that when assembled in conjunction with or onto, a PCB, may facilitate a self-alignment onto the PCB. An LTCC circuit and/or device may have elements and/or design features that when assembled in conjunction with, or onto, a PCB, may facilitate a self-alignment onto the PCB. Such self-alignment may occur during reflow solder assembly or another assembly process.

A shielding structure may, when electrically and/or mechanically attached to an enclosed LTCC circuit and/or device, improve the suppression of unwanted, undesired, or otherwise out of band electrical signals that may be transitioning the device. Such suppression may be refereed to as isolation, or signal isolation. In an exemplary embodiment of a filter device, e.g. an LTCC based filter, rejection of signals that may be considered to be in a stopband frequency bandwidth may be increased and/or improved. For example, the addition and/or use of a shielding enclosure improves a stopband rejection of a surface-mount filter, and such a filter may be constructed using one or more LTCC circuits and/or devices. A passband frequency bandwidth of such a device may be preserved, or experience no or minimal degradation, as compared to a device without such a shielded enclosure. Use of such a shielded enclosure may produce no, or limited, other ill or degrading effects, or perceptible ill effects, on the signal desired to transition the device, e.g. an electrical signal in the passband, for example, there may be no, or an insignificant, reduction in an inseetion loss of a circuit.

An exemplary embodiment may be a three-dimensional rectangularly shaped electrically conductive shielding structure encircling an LTCC filter, such electrically conductive shielding structure operably connected to the signal ground of the filter to form part of the filter grounding circuit. Such an electrically conductive shielding structure may be formed as part of an LTCC filter, or alternately may be formed separately and be operably attached to an LTCC filter. Another exemplary embodiment may be an electrically conductive shielding structure formed separately and operably attached to an LTCC filter, where such electrically conductive shielding structure encircles on three sides, and may be attached to a PCB with a ground plane, and the PCB ground plane may form a fourth side together with the electrically conductive shielding structure to provide encapsulation. In some exemplary embodiments a fourth side in a plane parallel to the third side may be operably, electrically and/or mechanically attached to the first and second sides, and may be designed to and/or constructed to operably, electrically and/or mechanically attach to a ground plane on a PCB.

In an exemplary embodiment an electrically conductive shielding structure may be three-dimensional rectangular in form and/or structure, and have at least three electrically conductive sides, each external and around an LTCC circuit, e.g., an LTCC filter, an LTCC power divider or combiner, an LTCC coupler, another LTCC passive circuit, an LTCC active circuit, and/or any combination thereof. Two such sides may be in planes parallel to each other and a third side may be between the other two sides and be in a plane perpendicular to such parallel sides. Such a third side may be in a plane parallel to a PCB onto which an electrically conductive shielding structure and an associated LTCC circuit, e.g., an LTCC filter, may be operably, electrically and/or mechanically attached. Other exemplary embodiments may include an electrically conductive shielding structure that may be on a fifth and/or a sixth side, operably, electrically and/or mechanically connected to an electrically conductive shielding structure on the first, second, third and fourth sides, such fifth and sixth sides each located in a plane parallel to each other, and such parallel planes perpendicular to the planes of both the first and second sides and parallel to the planes of the third and fourth sides.

Exemplary embodiments may have one or more aperatures within each of two or more sides to allow for passage of electrical signal energy between an interior and an exterior of an electrically conductive shielding structure without making electrical contact to the electrically conductive shielding structure. An aperature may include an electrically conductive wire, transmission line, lead etc., at one end operably connected to a circuit, e.g., an LTCC circuit, within an electrically conductive shielding structure, and an opposing end to be connected to an external electrical circuit, e.g., a circuit on a PCB, such an opposing end may be, for example a pad, port, or other designation. Such an electrically conductive wire, transmission line, lead, etc., may be mechanically attached to an insulator material, such insulator material electrically isolating it from a surrounding electrically conductive shielding structure, and mechanically attaching it to such electrically conductive shielding structure. An insulator material may be a polymer, a plastic, a dielectric material, e.g., polytetrafluoroethylene (PTFE), glass, or any other suitable insulator material. An insulator material may be mechanically attached to form a hermetic seal, and an enclosed circuit, e.g. an LTCC circuit, may be, for example, hermetically sealed within an electrically conductive shielding structure.

An exemplary embodiment may have one or more sides, e.g., external face of sides, of an electrically conductive shielding structure that may be smooth and/or fully or substantially within a single plane corresponding to each single side. Another exemplary embodiment may have one or more sides, e.g., external face of sides, of an electrically conductive shielding structure that may be smooth and may have a convex shape, e.g., a bulge, outward from the electrically conductive shielding structure, for example as may be associated with an epoxy fillet or conductive epoxy fillet.

A shielding structure may be designed for manufacturability. It may have features of one or more units that may be milled into a single workpiece and may prevent a necessity of re-orienting such a workpiece within a construction device, e.g. a mill or milling machine. One or more devices may be removed or separated from a workpiece, for example by a cutting or dicing process. Individual devices that may be separated from a workpiece may undergo one or more finishing processes.

According to embodiments of the invention, a shielding structure may have one or more features. Such features may be milled into a material during the manufacture of a shielding structure and may have a common orientation. A common orientation of such milled features may permit machining, or modification by manual, automated, computer numerical controlled (CNC) machine, or by another machine type, to be performed without a need or a necessity to re-orient the position of a workpiece, for example with respect to a machine. An orientation may remain steady or constant during such machining or manufacturing process. Other manufacturing processes, e.g. dicing or deburring, may occur with the part oriented differently, according to each different process.

There may be cavities, or regions of relief or removal of material, above a component, e.g. an LTCC component and/or its signal terminals. Such cavities may have an effect of reducing parasitic capacitance or other undesired effects. Parasitic capacitance may refer to an undesired and/or unavoidable electrical capacitive effect between conductive portions of a circuit which may cause a circuit to exhibit an electrical impedance different from its desired and/or design value. Inclusion of one or more such cavities may allow a shielding structure to be used, connected or implemented, and will not cause any noticeable or relevant degradation or reduction in a desired electrical performance of a device or circuit. Cavities referred to as being positioned, for example, above a component, e.g. an LTCC component and/or its signal terminals, may, for example, refer to a position on an opposite side of a component circuit the may be mounted to a PCB, where such a PCB may be referred to as, for example, being below a component.

A cavity may be milled into a workpiece during a manufacturing process of a shielding structure and may be milled in any direction, according to the manufacturing process. For example, a cavity may be milled down from a higher to a lower vertical position. In an exemplary embodiment, a workpiece that may be manufactured into a shielding structure may then be installed in an inverted configuration, for example relative to the direction of milling and/or manufacture, and such a cavity may then be positioned vertically above a component or circuit, e.g. an LTCC device. Following installation or attachment of a shielding structure to a device or circuit, e.g. an LTCC device, LTCC circuit, etc., an assembled piece, that may include both a device or a circuit and a shielding structure, may be oriented in any direction or orientation. Such orientation or direction may be according to a desired electrical performance, compatibility with another manufacturing process, e.g. attachment to a PCB by solder, solder reflow, epoxy, etc., or any other purpose that may allow a use of the assembled device.

Embodiments of the invention may include one or more design elements to increase an ease of manufacturing, assembly, etc. There may be a grounding structure that may wrap around, for example, an LTCC component. A structure with such a wrap-around ground element may facilitate attachment of a shield, or shielding structure, to a PCB or other supportive structure with a mechanical attachment process, for example a solder reflow process. A wrap around grounding structure may be continuously electrically conductive and/or operably continuously electrically conductive, for example creating a Faraday encapsulation effect, capacitively coupling electrical encapsulation, or any other electrical encapsulation operative at least across one or more operational frequency bands.

A shielding structure may include a solder cup, or other relief in the material, for example, to capture solder or other attachment materials. A solder cup may facilitate assembly and may be used for precision control of alignment and/or precise dimensional control of an assembly process. Precise control may be necessary, for example to prevent a solder fillet from becoming too thick, which may cause a shield to sit too high on top of a surface-mount component, and may cause difficulty or prevent electrical and/or mechanical attachments, e.g. legs, from contacting metallization on a PCB. Electrical contact to a PCB metal is desired to transfer electrical signals between a PCB circuit and a component, e.g. an LTCC device. Mechanical contact and/or a mechanical connection, e.g. a solder attachment, may be used for mounting such a component, e.g. an LTCC device, with continuous electrical contact to a PCB and PCB circuit. A solder cup may be used to maintain a minimum thickness of a solder fillet. In some exemplary embodiments, a flat surface, for example, in place of a solder cup may present a difficulty in maintaining a minimally thick solder fillet. Excess solder may remain within a solder cup, or may be wicked into a solder cup, e.g. by capillary action, or other movement processes, and may occur when such solder may be in a molten state. Solder that may be placed into a solder cup may be in a paste or any other suitable form. Such solder may be used for attachment of a shield to a device, e.g. an LTCC device. A solder cup may be used to control and/or predetermine an amount of solder to be used during an assembly or attachment process. A solder cup may be a predetermined size, or with a predetermined interior volume, that may correspond to a predetermined amount of solder to be used in an associated assembly or attachment process.

A solder cup may be used with solder in any form, for example solder wire, solder paste, solder bar, etc., and may be with or without flux that may be for improved solder adhesion. Solder or solder paste may, for example, compensate for a variation that may be in one or more gaps at points of contact. Solder or solder paste may provide a self-centering and/or an alignment aide function. Solder or solder paste may have low resistivity properties that may produce low resistivity connections. Solder or solder paste may be used to attach a shield to a PCB. In some embodiments different solder, solder types and/or other attachment methods may be used to attach different elements of embodiments of the invention alone or in combination.

In some exemplary embodiments, a shielding structure may be mechanically attached by an intermediary element, for example, a conductive elastomer, a mesh film, e.g., an Indium mesh film, or any other suitable electrically conductive mechanical intermediary attachment element. Such an element may provide compensation for mechanical voids or gaps, for example that may arise from surfaces that may not be fully flat or fully smooth. Such an element may aide in visual alignment, either manually or mechanically. Such an element may provide a low resistivity contact among element being attached. Such an element may provide for attachment and/or securing to a PCB. One or more such elements may be used alone or together. Other mechanical attachment devices and/or techniques may be used, for example an attachment where a partially flexible attachment tab on a shield may be inserted into a corresponding aligned hole on a PCB, e.g., a "snap-in" attachment, alignment pin, etc.

A shielding structure may be internal, for example, internal to an LTCC device, e.g. an LTCC filter device. Such an internal shielding structure may be within a surface mount technology (SMT) device, for example a surface mount LTCC filter, a surface mount LTCC passive circuit, e.g., a power divider, coupler, etc., or other LTCC device of singular function or multiple function. An internal shielding structure may increase isolation and/or rejection of undesired signals, e.g. RF power signals, impinging at a predetermined frequency band for rejection by a filter, e.g. a filter constructed in a surface mount device. Such an internal shielding structure may improve the stopband rejection of a filter, e.g. a surface mount filter. An internal shielding structure may be designed and constructed to not interfere with a passband performance of a filter while providing an increase in stopband rejection. An internal shielding structure may be designed and constructed to either act independently or in conjunction with an external shielding structure, for example by interfacing with an external shielding structure. A rejection of signals may be a prevention of signals from transiting, for example, from an input to an output of a device or circuit. A filter may be an electrical circuit designed to allow transiting of a predetermined frequency band of electrical signals while simultaneously preventing transiting of one or more other predetermined bands of electrical signals, for example, from an input to an output of a device or circuit. A filter may be referred to as a frequency selective electrical circuit.

An LTCC device may possess or include metallization on its top and/or sides, constituting a package with built-in electromagnetic shielding. Such a shielded package may have metallization printed, sputtered, or otherwise applied to one or more surfaces, e.g. faces, and may provide shielding to prevent RF signal leakage, for example leakage and/or transmission of electrical signal energy between an interior and an exterior of such shielded package. A shield metallization of such a package may make electrical contact with a ground plane of a carrier PCB, onto which it may be mounted, or other structure. A thickness of a shield metalization may be, for example, a minimum thickness to prevent electrical and/or RF signal leakage, and may include a minimum thickness sufficient for a skin depth of an electrical and/or RF signal. A thickness may be a minimum design thickness, a predetermined thickness or may be greater than, for example, a predetermined minimum thickness. A shield metallization of such a package may have openings surrounding signal pads, or ports. Signal pads may be surrounded by shield metallization openings that may permit transmission of electrical signals, for example, into and/or out of a device, package, etc., through, for example, a coaxial transmission line, TEM transmission line, or other structure.

An interface between an internal shielding structure and an external shielding structure may be by a direct electrical connection, an RF energy coupled connection, or any other connection method to provide an interface for continuity of shielding of RF signal energy. An LTCC device may contain an internal grounding structure, for example, a grounding cage which may act in a manner according to a Faraday cage, or according to other similar electromagnetic principles, and may provide an internal RF signal power circuit ground. Such a device may be operably and/or electrically connected to external terminal, for example for an external connection to RF signal power grounding elements of an external electronic circuit, e.g. an external circuit on a PCB.

An interface may have design elements and/or features to facilitate operation together between an external shielding structure and an internal shielding structure. Design elements may be geometric features, individual electronic circuit elements, e.g. lumped elements, for example, resistors, capacitors, inductors, etc., distributed circuit elements, e.g. transmission lines, coupling structures, etc., or any combination thereof. Design elements may be part of an internal shielding structure, and external shielding structure, or both structures. Design elements may be separate to a device, a circuit device or circuit element, e.g. an LTCC device, an LTCC filter device, etc., or may be integrated within a device or element. An internal shielding structure and an external shielding structure may be constructed to use a common circuit ground element, a common external grounding structure, and/or any other circuit grounding structure or mechanism.

An internal shielding structure may be constructed using one or more fabrication processes. A fabrication process may be an LTCC fabrication process, another fabrication process, or a combination of an LTCC fabrication process and one or more other fabrication processes. An internal shielding structure may be constructed to be used with a device that may be mounted into a quasi-transverse electromagnetic (TEM) circuit, e.g. a microstrip electronic circuit, a full TEM circuit, e.g. a stripline electronic circuit, or other electronic circuits or electronic structures. An internal shielding structure may be constructed to be used with a coplanar waveguide electronic circuit and may be in a microstrip configuration, a stripline configuration, or another coplanar waveguide or other waveguide configuration. Such a shielding structure may include features and/or elements, for example tabs, pins, protrusions, coupling elements, etc., to interface with a circuit, e.g. a microstrip circuit, a stripline circuit, etc. An LTCC device may be constructed with one or more internal shielding structures, and each may be operably and/or electrically connected to an external shielding structure, either by an independent connection or by a shared connection. An internal shielding structure may be integrated into an LTCC device or circuit, located around, either partially or fully, e.g. fully encapsulating except for active circuit transmission conductors, an LTCC device or circuit, or may be around one or more parts of an LTCC circuit device. An internal shielding structure may be constructed to be within an exterior package of an LTCC device.

A device, for example, an LTCC device, or a circuit within an LTCC device or package, may be constructed with an internal shielding structure. An internal shielding structure may be connected to an external shielding structure. An external shielding structure may be continuous around a plurality of sides, e.g. four sides, six sides, etc., of a rectangular solid structure for containing or housing an RF circuit, including RF circuit parts and/or elements. A shielding structure may be constructed, for example of a metal electrical conductor, and may be a shielding conductor. A shielding structure may be on and/or continuous with a surface to be attached to a printed circuit board (PCB). A surface for attachment to a PCB may have a shielding conductor covering all or part of such a surface. A part of such an attachment surface may have one or more conductors that may be electrically connected to circuit elements that may form an electrical circuit and/or structure, e.g. a filter circuit, that may have a conduction path electrically isolated from a shielding structure, and such conductors may be electrically isolated from a shielding structure. Electrical isolation may be by physical separation of conductors on a surface, and such a separation may be large enough to prevent electrical signal coupling from occurring across the separation. A range of separation distances may constructed, for example a separation distance my be equivalent to a dimension of a conductor electrically connected to an input or an output of a filter circuit. Or a separation distance may be larger than a dimension of a conductor electrically connected to an input or an output of a filter circuit, for example two times larger or three times larger, or any other suitable separation distance. A conductor electrically connected to an input or an output of a circuit, e.g. filter circuit, may be encircled by a shielding structure or may extend to the edge of a surface. A conductor electrically isolated from a shielding structure may be formed together with a shielding structure and an electrically isolating insulator, or a predetermined separation distance, or both, to form a transmission line or transmission line structure, e.g., a TEM transmission line or a quasi-TEM transmission line.

A shielding structure may be constructed such that it employs one or more full tape thickness features. Such full tape thickness features may provide improved and/or optimal electrical grounding for ground connections of a circuit, e.g. an LTCC filter circuit, or of a shielding structure, e.g. an internal or an external shielding structure of an LTCC circuit. A full tape thickness feature may refer to a conductive trace embedded within a dielectric layer of an LTCC, and may be an alternate to such printed upon it. Such full tape thickness features may provide improved and/or higher isolation of RF signals from external interference and/or coupling. Other than full tape thickness may be used, and may have corresponding RF signal isolation performance.

A printed circuit board (PCB) may be used to accept mechanical mounting and/or electrical connection of devices, e.g. LTCC devices, according to embodiments of the invention. Such LTCC devices may be mechanically and/or electrically attached to such a PCB. Such a PCB may have sections of its ground plane in the area of attachment where metallization may have been removed, for example, a ground plane cut-out. Such a cut-out may be used to constrain a position of electrical connection leads of a device, for example an LTCC filter, during a manufacturing process. An exemplary manufacturing process may be reflow soldering. Other suitable manufacturing processes for attachment of the device to the PCB may also be used. Such electrical connection leads, e.g. legs, may be metalized connections that transition from, the interior to the exterior of a shielded device, and may electrically or operably connect to input and/or output ports of an enclosed device, e.g. an LTCC filter. Such leads may extend through an aperture in the shielded enclosure and may be electrically isolated from such a metallic shielded enclosure. An end of such leads that may facilitate attachment external to a shield may be used to attached the shielded component assembly to a PCB, for example by a surface-mount attachment process.

Such a PCB may be manufactured to have thin traces or electrical conductor connections. Such traces may be considered thin with respect to electrical conductors on the same PCB that may have larger widths in order to maintain a specific characteristic electrical impedance or a predetermined electrical impedance. Thin traces may provide additional surface tension, which may prevent solder outflow without the use of a solder mask, among other benefits. Solder outflow may occur, for example when solder may be in a molten state. Solder may be a paste, a wire, a sheet, or any other suitable structure compatible with solder attachment manufacturing. In some exemplary embodiments attachment mechanisms other than solder, or in combination with solder, may be used.

In some embodiments, an electrical impedance may be an electrical signal resistance of alternating current (AC) signals and their associated electrical signal energies transitioning an electrical conductor. An impedance may be a complex ratio of voltage to current, e.g. AC voltage and AC current. Electrical impedance across a transition among electrical conductors, electrical devices, electrical circuits and/or combinations of the like, may be constant when an electrical impedance of each conductor, device, circuit and/or combination may be substantially the same. When an electrical impedance differs, a mismatch may be created. Such a mismatch may have a characteristic of an increase in reflected electrical energy. Such a mismatch may be characterized by a reduction in electrical energy being delivered into or out of a conductor, device, circuit and/or combination.

Electrical impedance of a device may vary with varying frequencies of AC signals and may be considered to be frequency-dependent devices. Devices for selecting specific frequencies of electrical energy, e.g. baseband signals, passband signals, radio frequency (RF) signals, microwave signals, millimeter-wave signals, etc., for transition through one or more conductors, devices, circuits and/or combinations while rejecting other specific frequencies of electrical energy may be considered to be and/or referred to as filters. Filters may be constructed using low temperature co-fired ceramic (LTCC) materials and/or processes and may be LTCC filters. LTCC filters may be individual devices or part of an electrical circuit. Other devices, e.g., couplers, power dividers and/or combiners, amplifiers, etc., may have a varying electrical impedance with frequency, and may be constructed using LTCC materials and/or processes.

A PCB may have other features, for example, a stepped leg cross-section. A stepped cross-section, as depicted by figures herein, may refer to a stepped decrease in cross-sectional area of a mounting leg of, for example, a filter that may be adjacent to its contact area upon a PCB. A stepped leg cross-section may be used to reduce an amount of solder needed to mount a shield, according to embodiments of the invention. Use of such a stepped leg cross-section may reduce a tendency of a shield to reposition, or "float," during a manufacturing process, e.g. reflow soldering. A number of steps of a stepped leg cross-section may be predetermined.

An exemplary embodiment may be a grounding structure that may surround a device, e.g., an LTCC device, a surface mount device, etc., that may be formed by application of a viscous substance having metallic properties, e.g., an epoxy with a metallic element content. For example, such a substance may be a silver loaded epoxy. Such a viscous substance may be cured, e.g., by exposure to an ambient atmosphere for a period of time, by exposure to elevated temperatures for a period of time, or other curing methods. Curing may be a process whereby such a viscous substance may become hardened, and may become attached and/or bonded to any surface on which it may be in contact. Such a substance may be applied by brushing onto and around, for example, an LTCC device, by mechanical application, either manually, automated, or a combination thereof. Such a substance may be applied such that it may be in contact with a ground plane, for example of a PCB, that a device may be mounted upon. For example, a silver loaded epoxy may be applied around at least three sides of an LTCC device, or LTCC filter, having a rectangular prism shape, and may extend beyond at least one of such sides onto a PCB onto which an LTCC device may be mounted that may be in contact with a ground plane of a PCB, thus may provide an electrical and/or electrically operable contact with such a ground plane. In some embodiments, such a silver epoxy may not be in direct physical contact with a ground plane, and may be in electrically operable contact with a ground plane, for example by electrical signal coupling. In some embodiments, a silver epoxy may be in direct physical and/or electrical contact with grounding elements, signal ground points and/or other circuit ground points of an enclosed, or partially enclosed, circuit or device, e.g., an LTCC circuit or device. In other embodiments, a silver epoxy may be applied so as to be substantially physically close to such grounding elements, signal ground points and/or other circuit ground points of an enclosed, or partially enclosed, circuit or device, without having intimate direct physical and/or mechanical contact, and may have an operable electrical connection, for example by electrical signal coupling, by a Faraday shielding effect, or other similar electrical signal coupling and/or connection effects.

FIG. 1 depicts an exemplary embodiment of the invention. A shielded LTCC filter device 100 may be a metallic shield enclosure 150 or may be an enclosure made of another material, e.g. plastic, and may surround and/or encapsulate a device, e.g. an LTCC electrical AC filter circuit. A material other than metal may be plated with a metallic finish or metallic coating. A shield may have vertical metallic lined holes 110 or solid metallic filled holes 110, e.g., via holes, components, and/or other vertical metallic shielding walls 140. Via holes 110 may be electrically connected and/or operably electrically connected to one or more circuit elements, e.g., a transmission line, at either or both ends of such a via hole. A device 100 may be mounted onto a PCB 170, and a PCB 170 may be shown as a partial view in the vicinity of a device 100. A shield may be attached to a PCB 170 by device ground 120 being placed, for example, in intimate contact with, electrically connected to and/or mechanically connected to, a ground plane on PCB 170. A ground plane 120 of device 100 may form a side of a shield that may surround a circuit within device 100. An LTCC device, e.g., an LTCC filter, an LTCC passive component, etc., may have input and/or output connection leads 130 that may be connected to a transmission line and/or other electrical circuits and/or devices on PCB 170 and/or on other PCBs. A shielded LTCC filter device 100 may have a marking 160 on its outer surface, and may be on an opposing side of PCB 170 than a mounting surface 120, and may indicate a function of one or more lead connections, e.g. a marking 160 may be located near a particular LTCC circuit 100 lead connection to indicate a location of pin 1, an input pin, or another mechanical or electrical designation. A marking may be used for orientation of a device 100 when attaching it, for example, to a PCB 170. A size of a shielded LTCC filter device 100 may be depicted with a linear unit scale 180, e.g. millimeters, to indicate a small size of such a device. A feature and/or benefit of embodiments of the invention may be achieving such shielding effectiveness within a total package envelope of such a small size, as depicted by exemplary FIG. 1. Construction according to embodiments of the invention may achieve this performance result within such a small envelope. Such small sizes may be applicable to surface mount electronic devices, microelectronics and/or other minaturization technologies.

Figure 2:
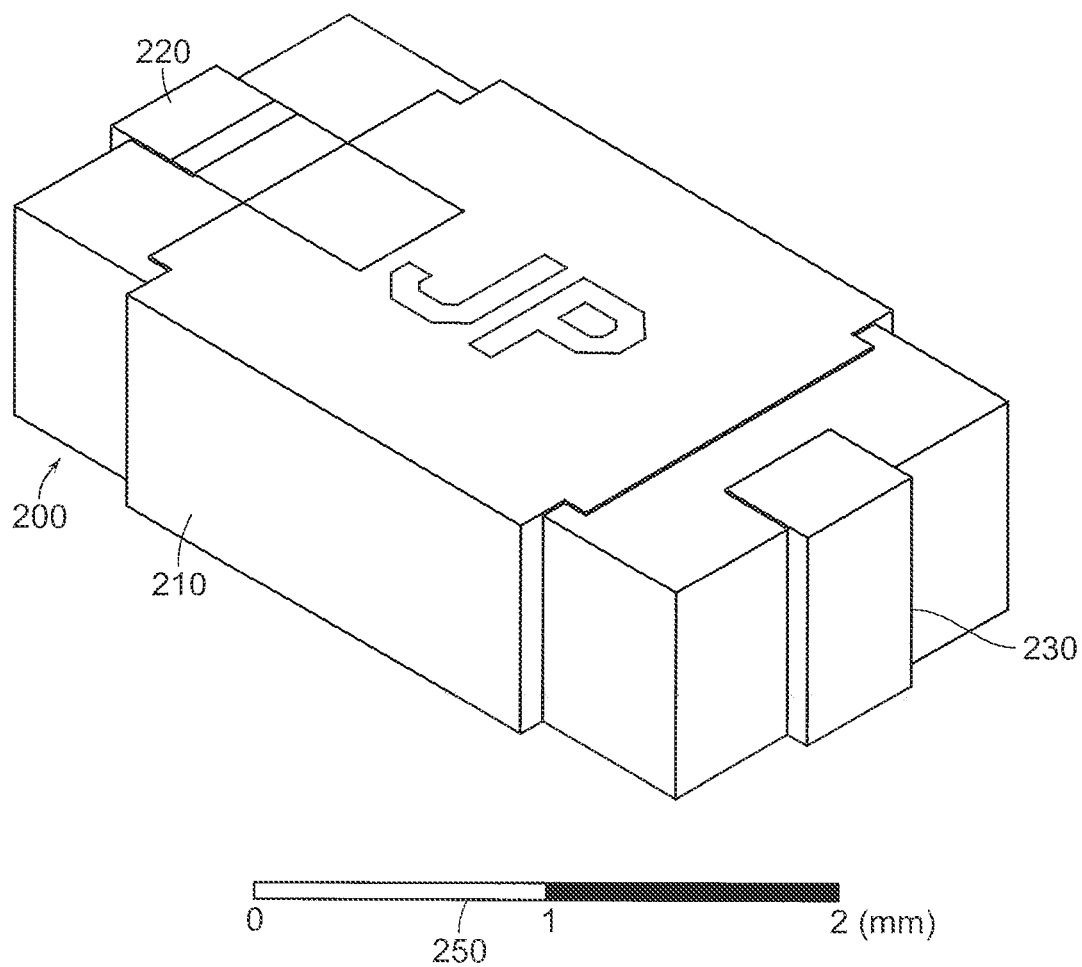
FIG. 2 depicts an exemplary diagram according to embodiments of the invention.

FIG. 2 depicts an exemplary embodiment of the invention. A shielded LTCC filter device 200 may be fully encapsulated by, for example, a ceramic package, excepting only input connection 220, output connection 230 and ground metallic connections and an aperature that may separate each of an input connection 220 and an output connection 230 from a shield 210. A metallic shield 210 may wrap around an entire circumference of such a solid rectangular package, for example a package in a shape approximately of a rectangular prism, and may be constructed for connection to an external ground, e.g. a PCB ground. Input connection 220 and/or output connection 230 may be constructed with a planar protrusion in the plane of the mounting surface, an "L" shaped protrusion with one surface co-planar with the mounting surface and a second extending surface extending vertically perpendicularly away from the mounting surface, or a "U" shaped protrusion with one surface co-planar with the mounting surface, a second extending surface extending vertically perpendicularly away from the mounting surface and a third surface extending from the vertical surface partially around the circumference of the device parallel to the mounting surface. A size of a shielded LTCC filter device 200 may be depicted with a linear unit scale 250, e.g. millimeters, to indicate a small size of such a device.

Figure 3:
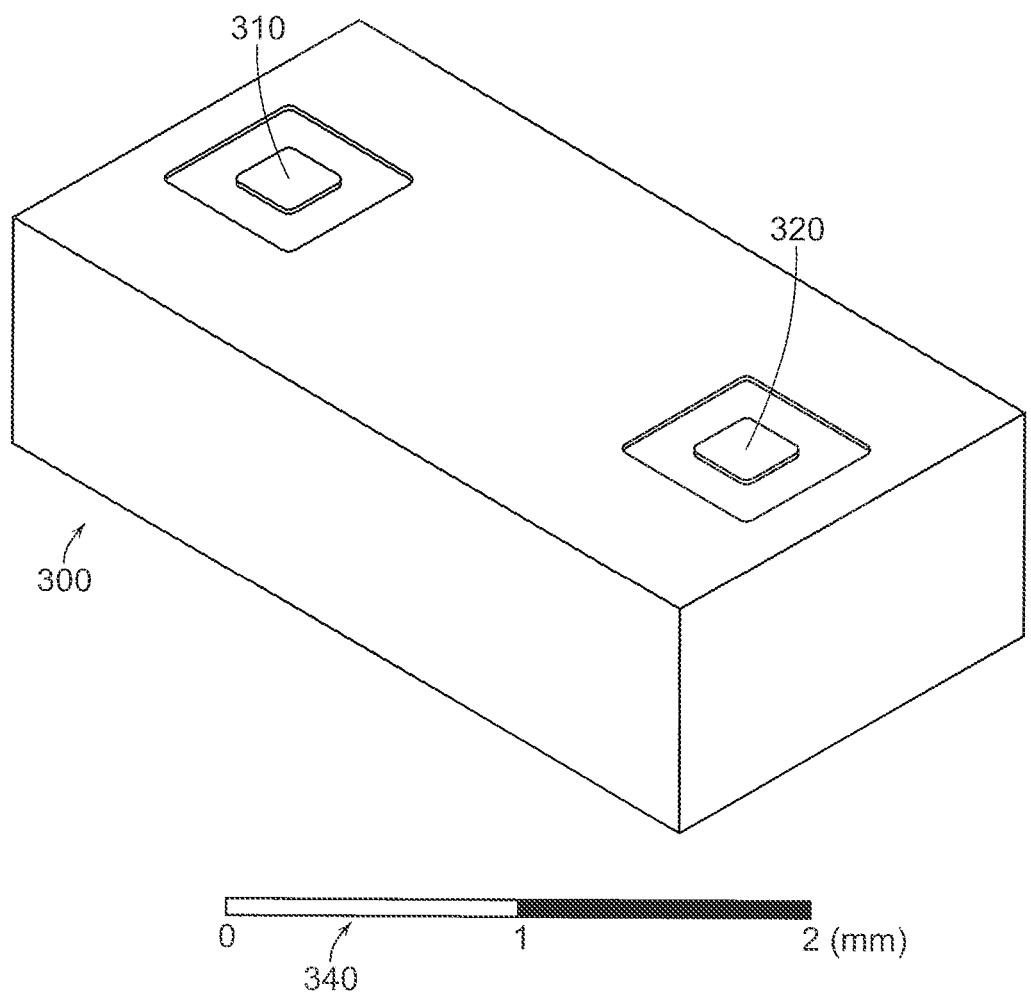
FIG. 3 depicts an exemplary diagram according to embodiments of the invention.

FIG. 3 depicts an exemplary embodiment of the invention. A shield 300 may encapsulate a device, e.g. an LTCC device or filter circuit, and may fully surround such device continuously across all six sides, excepting only an electrical connection terminal for an input 310 and an electrical connection terminal for an output 320 that may protrude from an interior of such a shield to an exterior of such a shield. Each of input lead 310 and output lead 320 may be separated from ground shield 300 by a planar relief area, e.g., an aperature, around each terminal lead 310, 320, larger than a terminal lead 310, 320, with no metal or electrical conductive material, such that there may be no electrical connection, or electrically operable connection, between either of these leads 310, 320 and aground shield 300. Such a relief area may reside in a same plane as a terminal 310, 320. In such an exemplary embodiment, a shield 300 may encircle such a relief area, itself encircling a terminal 310, 320, all in a same plane. When configured accordingly, such a device enclosed by shield 300 may be constructed to be compatible with a particular type of electrical circuit PCB, e.g. a stripline circuit, that may have, for example, buried layer transmission lines, or traces, and may have vertical electrical connection structures, e.g., via holes, that may extend from within such a PCB to a predetermined external contact area. Such a device may be configured for attachment of terminals 310, 320 to such a via at such a predetermined contact area. A size of the device 300 may be depicted with a linear unit scale 340, e.g. millimeters, to indicate a small size of such a device.

Figure 4:
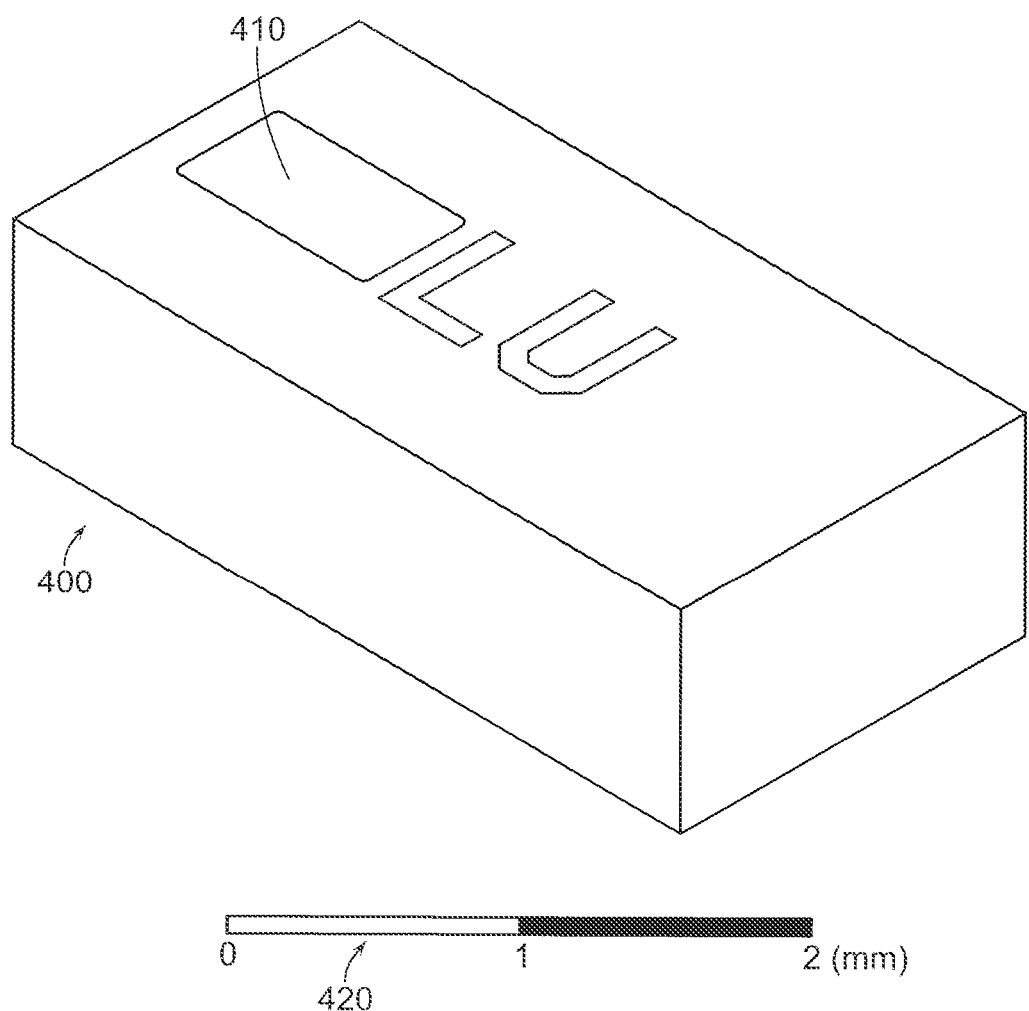
FIG. 4 depicts an exemplary diagram according to embodiments of the invention.

FIG. 4 depicts an exemplary embodiment of the invention. A device may be as in an embodiment depicted by FIG. 3, and may be observed from an alternate view, or an opposing view, as depicted by FIG. 4, that may show shield 400 fully encircling such a device, e.g. an LTCC filter electrical circuit, an RF circuit, etc. A marking 410 may be enscribed, printed, plated, or otherwise attached closer to an edge of shield 400 in a plane parallel to a mounting surface, and such plane residing on an opposing side to such mounting surface, e.g. in a solid rectangular package. Marking 410 may be used to indicate a function of a terminal or lead, e.g. a lead used as an input to an LTCC electrical circuit, an indication of guidance for orientation during attachment, or any other suitable function. A size of the device 400 may be depicted with a linear unit scale 420, e.g. millimeters, to indicate a small size of such a device.

Figure 5:
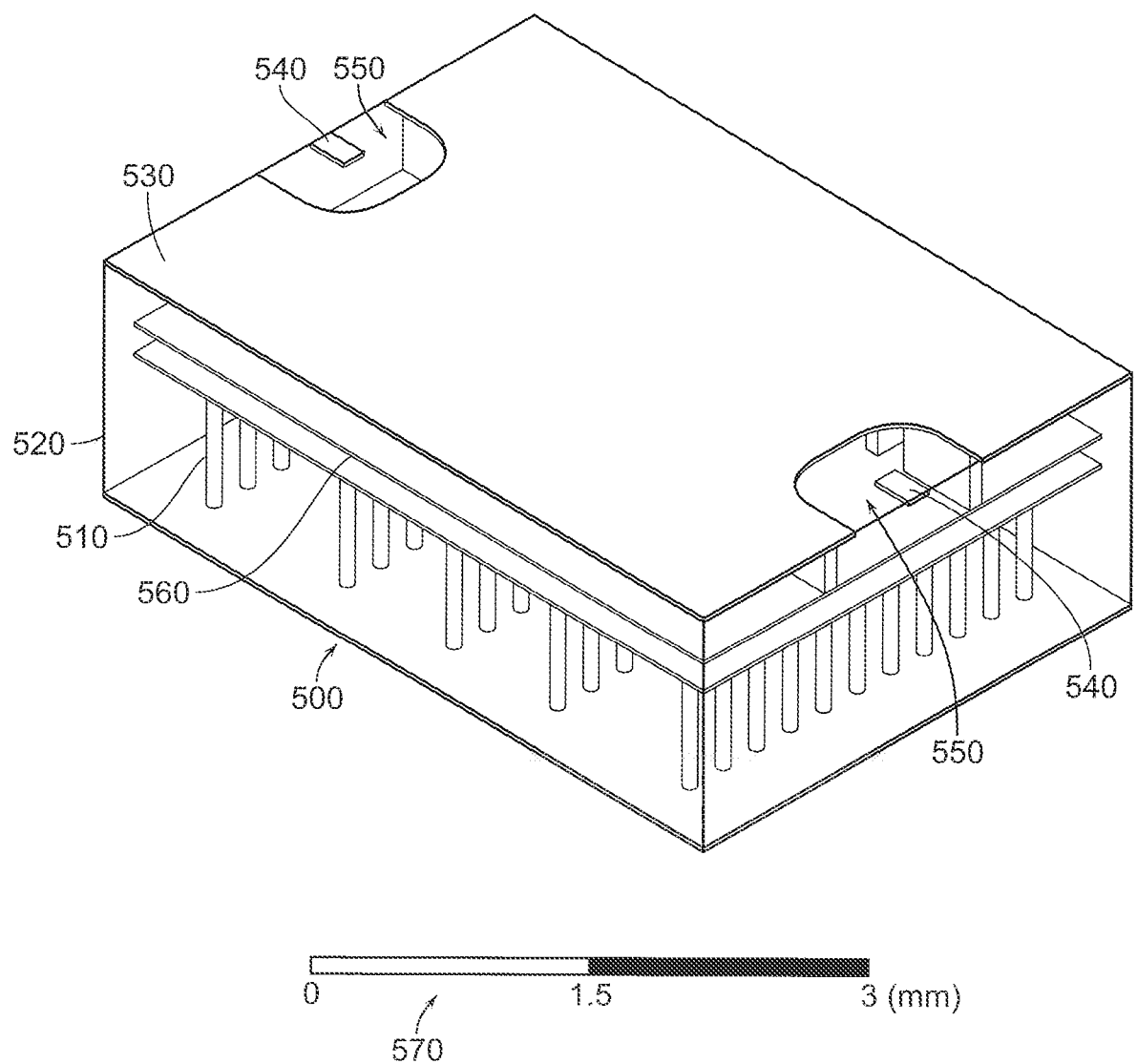
FIG. 5 depicts an exemplary diagram according to embodiments of the invention.

FIG. 5 depicts an exemplary embodiment of the invention. A shielded LTCC filter device 500 may be surrounded by a metallic shield enclosure 520 or may be an enclosure made of another material, e.g. plastic, and may surround and/or encapsulate a device, e.g. an LTCC electrical alternating current (AC) filter circuit, and may provide electrical circuit grounding. A shield may have vertical metallic via holes components 510, and/or other vertical metallic shielding walls or alternate internal shielding components. Vertical metallic via holes may be arranged to be operable as an electrical wall, for example an electrical shielding wall, e.g., by electrical signal coupling, where a distance between successive vertical holes may be reduced to prevent RF electrical signal leakage. An internal shield may include horizontal shielding elements 560, e.g. plates, walls, etc., and may be conductive and/or attached to a device circuit ground. A shield may be attached to a PCB with ground plane 530. An LTCC filter may have input and output connection leads 540 that may be connected to a transmission line and/or other electrical circuits and/or devices on a PCB. Each of input and output leads 540 may be separated from ground shield 530 by a planar relief area 550, e.g., an aperature, around each terminal lead 540, larger than a terminal 540, with no metal or electrical conductive material, such that there may be no electrical connection or electrically operable connection between either of leads 540 and a ground shield 550. Such a relief area may reside in a same plane, or substantially a same plane, as a terminal 540, and may wrap onto one or more adjacent sides. A size of a device 500 may be depicted with a linear unit scale 570, e.g. millimeters, to indicate a small size of such a device. Terminal 540 may be wholly within a same plane, or may wrap around one or more edges onto one or more adjacent sides that may be in one or more perpendicular planes. Terminal 540 may wrap from a first plane, extending around an edge onto an adjacent perpendicular second plane, and continue to a distant edge of such second plane, and may wrap again onto a third plane that may be perpendicular to a second plane and may be parallel to a first plane. Shield 530 may be electrically operably connected, electrically connected and/or mechanically connected to a ground plane, e.g., a ground plane on a PCB.

Figure 6:
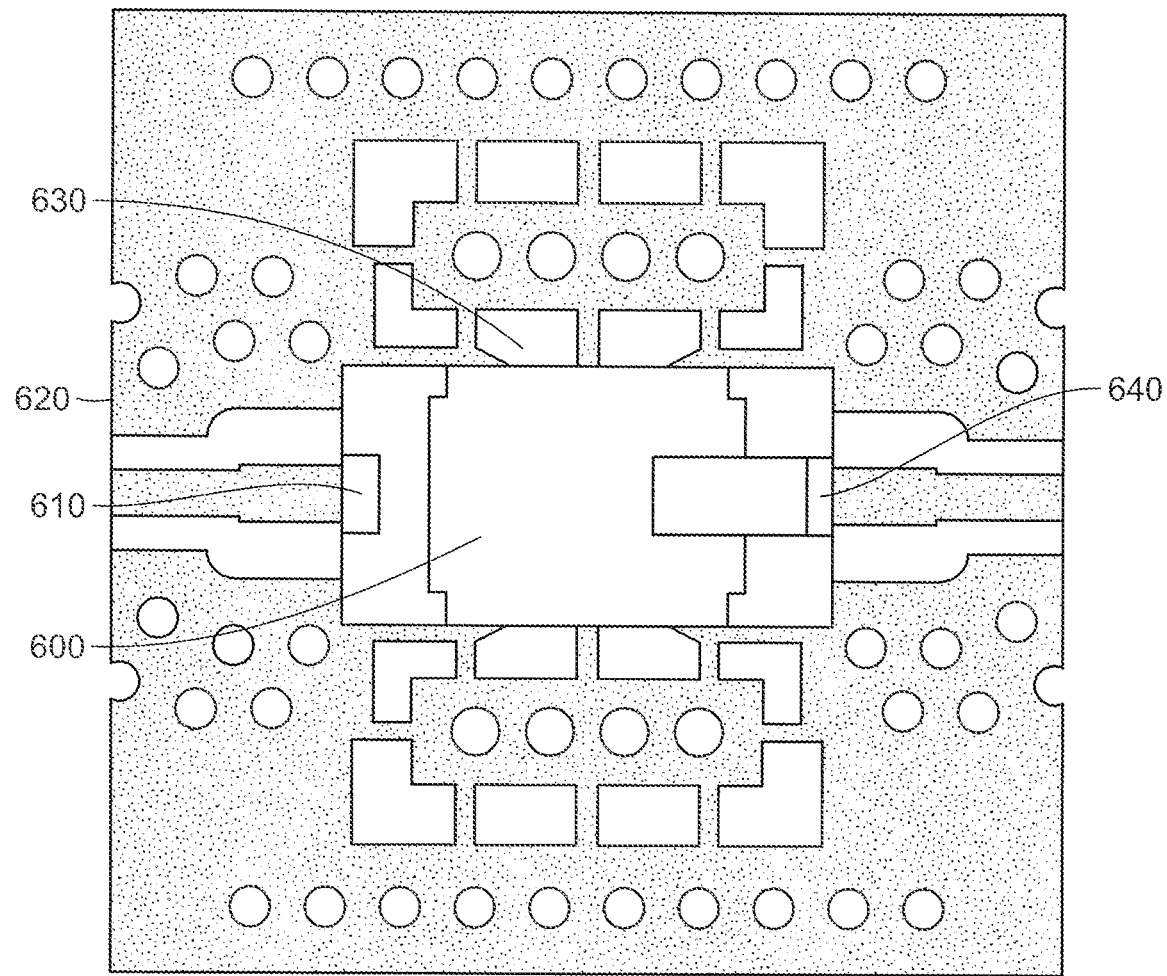
FIG. 6 depicts an exemplary diagram according to embodiments of the invention.

Referring to an exemplary embodiment depicted by FIG. 6, a device 600, e.g. an LTCC electrical RF filter circuit component, may be assembled or attached onto PCB 620. An input electrical lead connection may be made by attaching input lead 640 to, for example, an RF transmission line on PCB 620. An output lead 610 may be similarly attached and/or electrically operably connected, for example to another transmission line on PCB 620. A shield may be constructed around LTCC filter device 600 and may be attached to PCB ground 630. Such a shield may be attached on one side of device 600 or may be attached on two or more sides of device 600. Such a shield may be a metallic rectangular prism with aperature relief as described herein that may be attached to PCB 620 ground 630, or may be a paste applied to the exterior of device 600 and may contact and/or attach to PCB 620 ground 630

Figure 7:
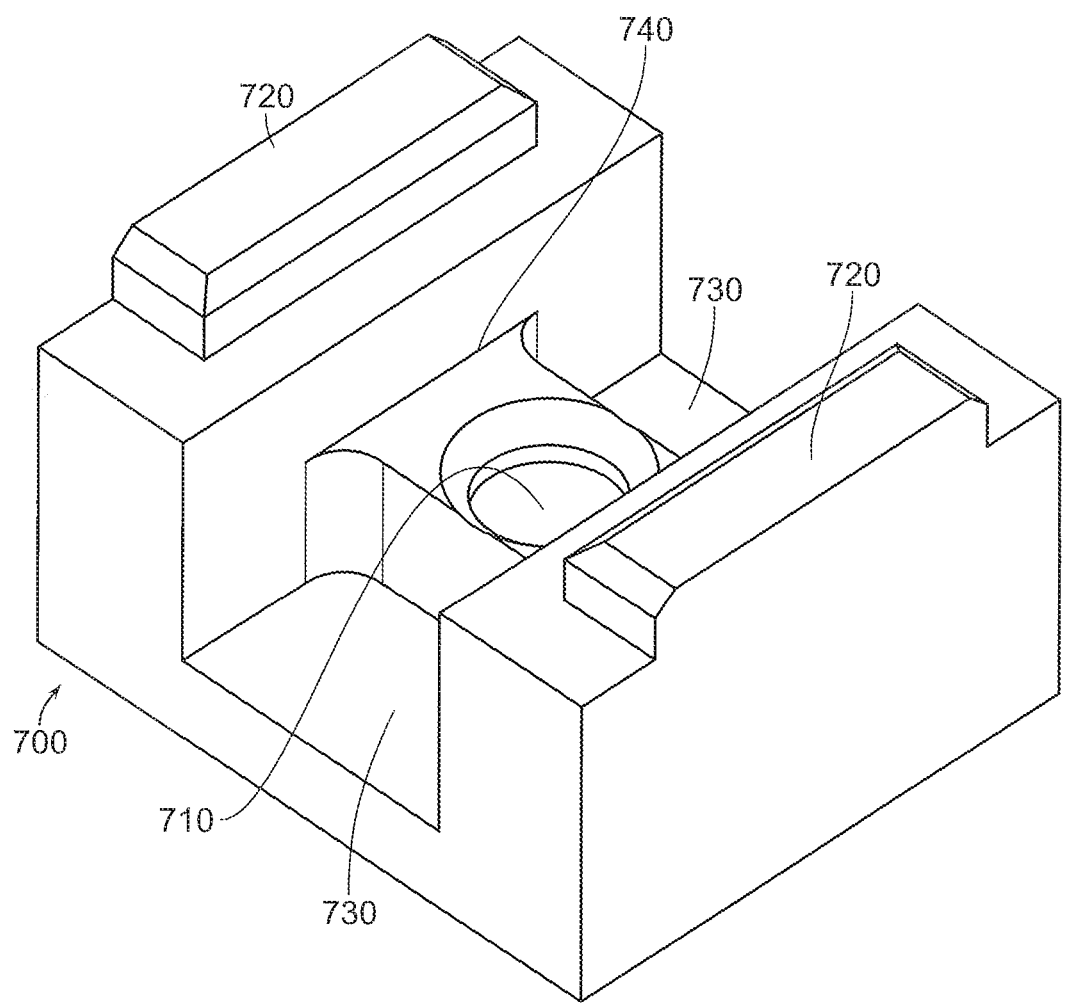
FIG. 7 depicts an exemplary diagram according to embodiments of the invention.

FIG. 7 depicts an exemplary embodiment of the invention. According to an embodiment of the invention, a metallic shield 700, e.g. a shield for enhanced RF electrical isolation of an enclosed LTCC frequency selective filter, may be constructed. Such a shield may be in a form resembling that of a rectangular prism, and may have aperatures as described herein, and may have extensions and/or protrusions 720 as described herein. Such a shield may have a solder cup 710 feature for ease of construction and/or attachment using solder, or for facilitating use of a predetermined amount of solder. A solder cup 710 may be a cylindrical area accessed from an interior of a shield 700, where metal may have been removed. Such an area 710 may be filled with air, a vacuum, a dielectric material, or other electrically non-conductive material, or a combination of such materials. One or more cavities 730 may be constructed, e.g. metallic shield material may be removed, milled away, etc., to form a cavity, such that cavities 730 may be located vertically above, or partially around, one or more filter circuit elements, or other electrical transmission lines, components, etc., when mounted and/or attached to such enclosed electrical circuit. Such cavities 730 may present a capacitive loading to an electrical element, e.g., a transmission line, a connection onto a transmission line, a passive circuit element, etc., encompassed by such cavity 730, and such a capacitive load may offset and/or cancel at least some of the electrical parasitic effects of, for example, a connection of a circuit or device onto a transmission line. A shield element may be comprised of one or more stepped shield legs 720, as part of such a shield, and may be, for example, for attachment to, for example, a PCB ground plane. In some embodiments, shield 700 may be manufactured on a same work part as other such shields, and may have a common orientation of features 740, e.g. milled features, among all such work parts. Vertically above may refer to a position relative to a component, for example an enclosed LTCC circuit, when such component is mounted to a PCB and such PCB is referred to as below a component. Metallic shield 700 may be a single metallic element, or may be comprised of two or more metallic elements or metallic plated elements, each electrically, mechanically and/or operably connected. A metallic shield 700 may be any electrically conductive metal, for example silver, gold, aluminum, brass, steel, a ferrous material, e.g., ferrous steel, Kovar, etc., and/or any combination or alloy of such metals. Any material having electrically conductive properties, for example at least within a frequency band of operation, may be used. A metallic shield 700 may be constructed of an electrically non-conductive material and then metal and/or metallization may be applied to an exterior of such material, and a thickness of such metal application may be sufficient such that a skin depth of an electrical signal conducted on or through its surface may not substantially penetrate into the electrically non-conductive material underneath.

Figure 8:
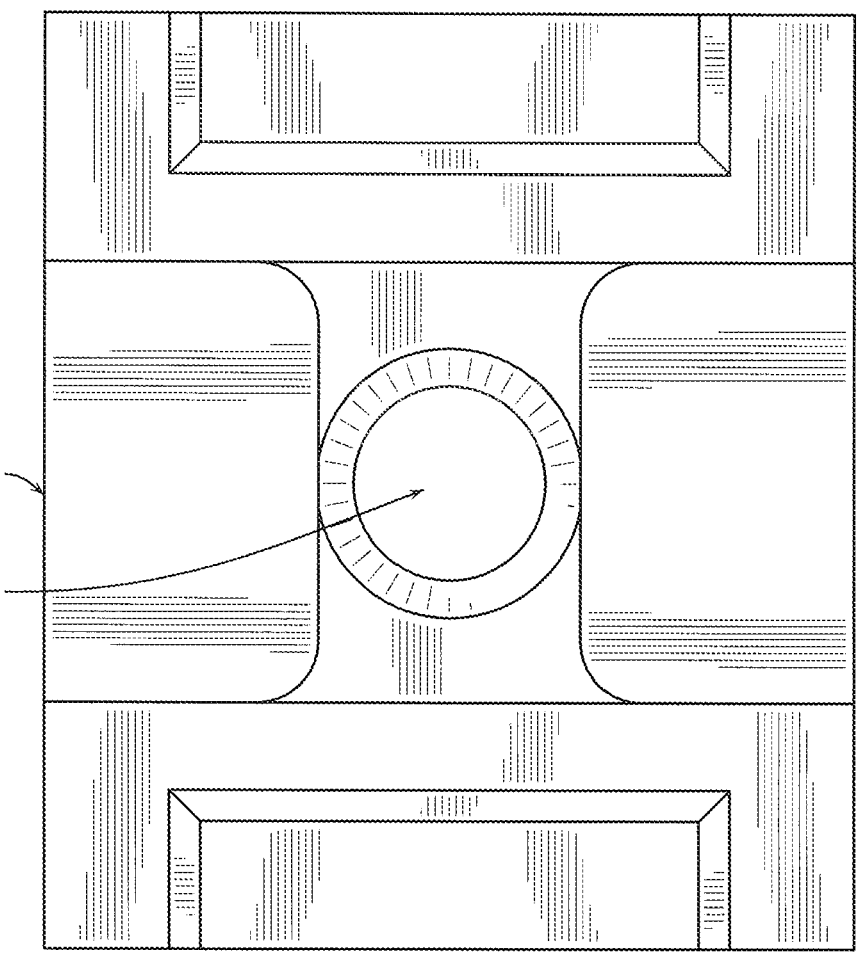
FIG. 8 depicts an exemplary diagram according to embodiments of the invention.

FIG. 8 depicts an exemplary embodiment of the invention. A shield 800 may be as in an embodiment depicted by FIG. 7, and may be observed from an alternate view, as depicted in FIG. 8, where such alternate view may be from where, for example, an LTCC circuit, an LTCC device, an LTCC passive element, e.g., an LTCC power divider or combiner, an LTCC coupler, etc., or an LTCC filter, may be inserted. Such a view of shield 800 may depict solder cup 810 as an exemplary embodiment where it may be a circular, or concentric cylindrical, solid feature. A solder cup may be any other suitable three-dimensional solid geometric shape, and may have at least one open side.

Figure 9:
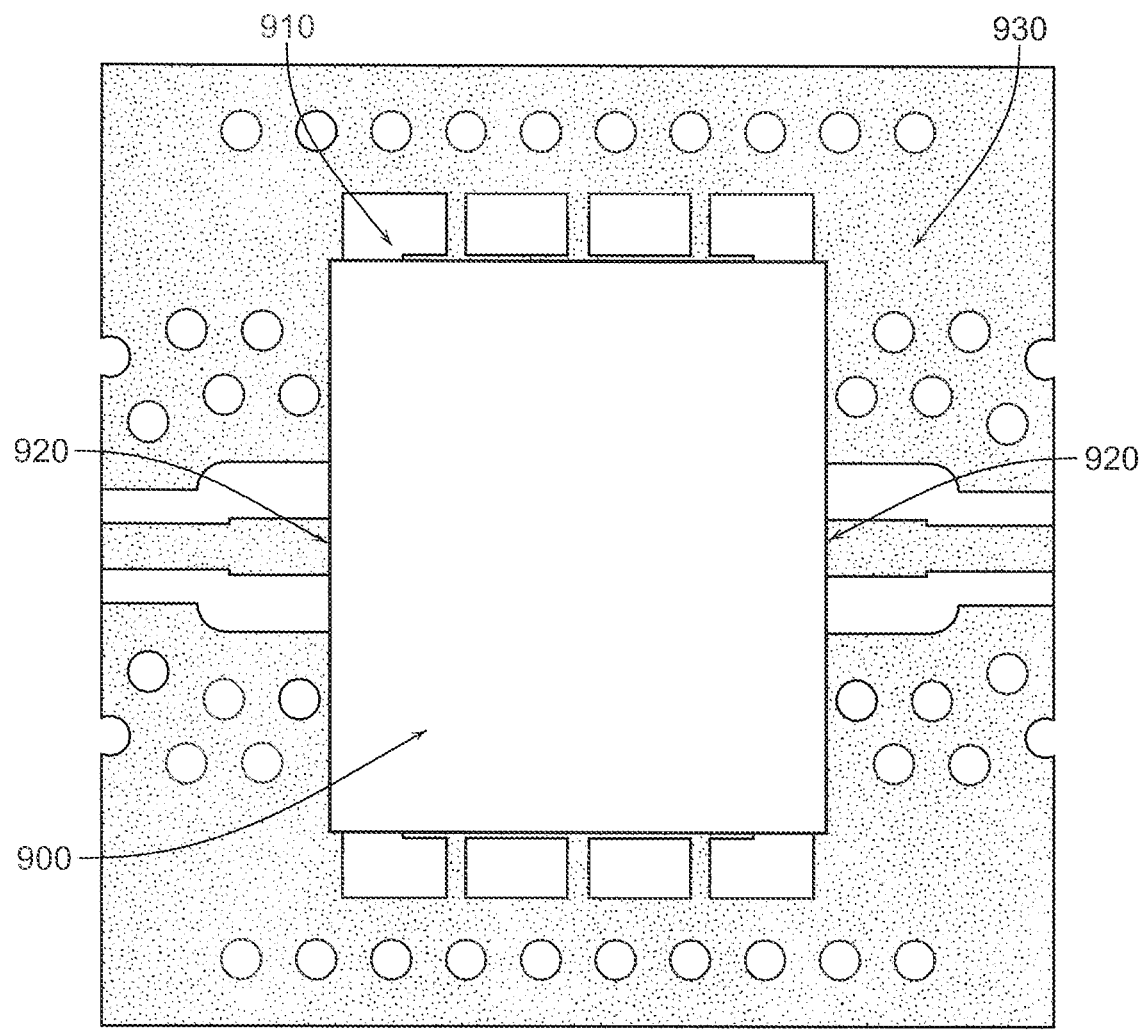
FIG. 9 depicts an exemplary diagram according to embodiments of the invention.

FIG. 9 depicts an exemplary embodiment of the invention. A surface mounted component 900, for example a shielded LTCC RF filter component, an LTCC filter component or an LTCC device, may be attached to a printed circuit board (PCB) 930. Connections 920, for example, an input connection 920 and an output connection 920, may be made between LTCC filter 900 and two or more, e.g. at least one input and one output, transmission lines on PCB 930. A shield of LTCC filter component and/or device 900 may be attached to a ground 910 or ground plane 910 on PCB 930. Other connections and/or other components may be attached to PCB 930.

Figure 10:
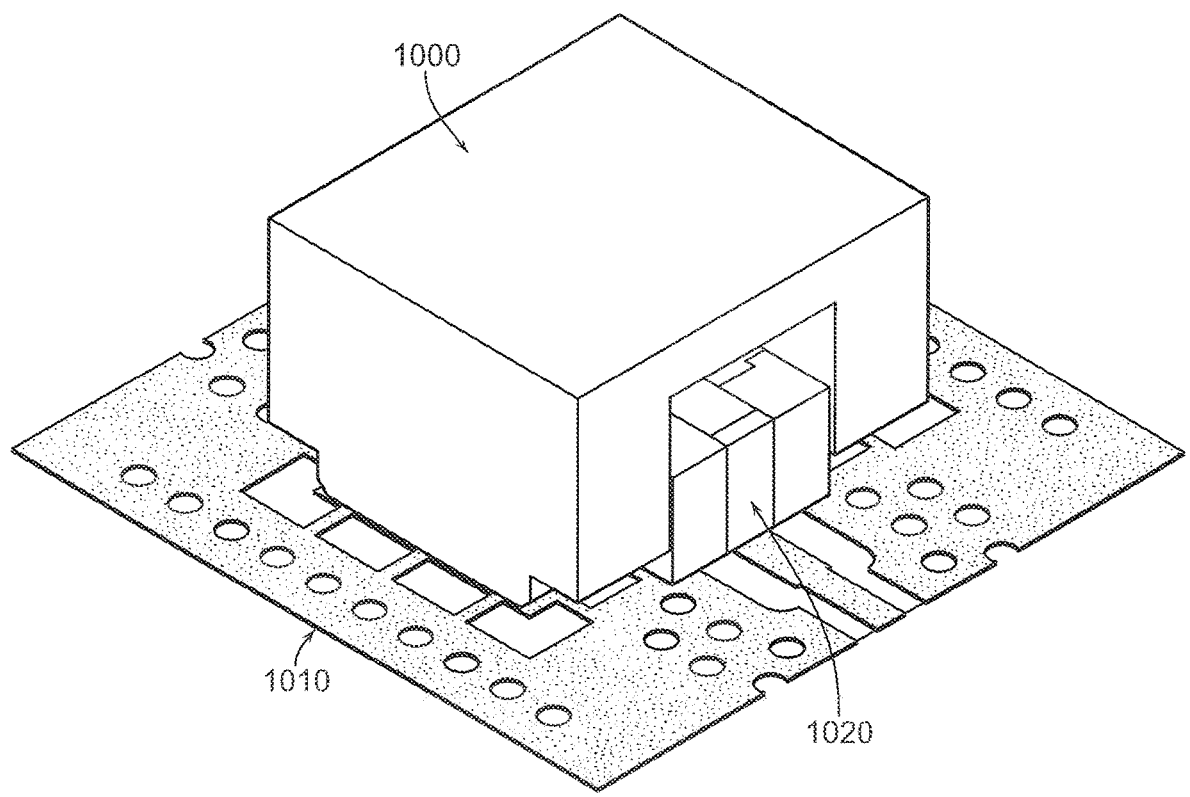
FIG. 10 depicts an exemplary diagram according to embodiments of the invention.

FIG. 10 depicts an exemplary embodiment of the invention. A component 1020, e.g., a surface mount component, a surface mount LTCC component or circuit, an LTCC passive component, an LTCC power divider or power combiner, an LTCC coupler and/or an LTCC RF filter component, may be surrounded by a shield 1000, and may be attached to a PCB 1010. Shield 1000 may be attached to LTCC filter 1020 prior to attachment to PCB 1010, during such attachment process, or after attachment of LTCC device 1020. According to embodiments of the invention, shield 1000 may operate in a same manner independent of when it may become surrounding of LTCC component 1020, with respect to an order of attachment to PCB 1010. Shield 1000 may be depicted with a first and a second side parallel to each other and each perpendicular to the plane of the PCB, each comprising, for example, solid electrical conductive material. Third and fourth sides of component 1000 may be parallel to each other and may be each mutually perpendicular to a plane of a PCB 1010, and a plane of first and second sides, where third and fourth sides each may have an aperature that may allow transfer of an electrical signal between an interior and an exterior of shield 1000. An aperature may comprise an air insulator, a ceramic insulator, a polymer insulator, a glass insulator, any other suitable insulator, or a combination of two or more insulators. For example, an aperature in shield 1000 may be depicted as a combination of an air insulator and a ceramic insulator, where a ceramic may be part of component 1020. An insulator may also include a separation on a PCB 1010 of a signal conductor, e.g., a circuit trace and a ground plane on a PCB 1010. An aperature may be designed and/or constructed as a transmission line, e.g., a TEM transmission line, and may have predetermined dimensions and/or predetermined distances between conductive lines and ground planes. An aperature may alternately be in a position where electrical signals may be conducted between an interior and an exterior of shield 1000 with one or more insulators, air gap, etc. between a signal conductor and a ground plane and/or shield 1000. A shield 1000 may be electrically attached and/or electrically operably attached to a ground plane on PCB 1010. A shield 1000 may be attached to a circuit ground point and/or connection of a circuit, e.g., an LTCC filter ground, an LTCC passive component ground, etc., of a surface mount component 1020. A shield 1000 may complete, for example, an electrical isolation signal barrier around component 1020.

Figure 11:
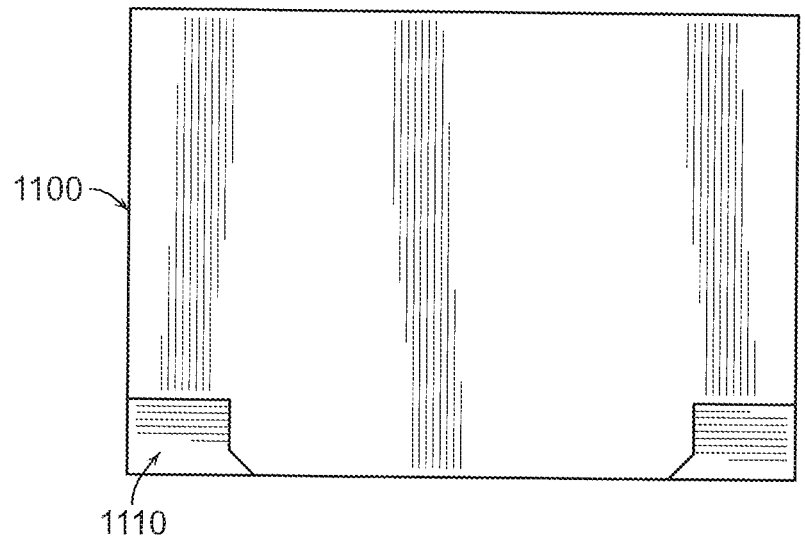
FIG. 11 depicts an exemplary diagram according to embodiments of the invention.

FIG. 11 depicts an exemplary embodiment of the invention. Shield 1100 may be comprised of a homogeneous material, or of two or more materials 1110 fused or otherwise attached, layered or combined together, or of two or more layers of a same material, or any combination thereof, to form such a shield 1100. Shield 1100 may represent a shield internal to a device or external to a device, or both. Two or more materials 1110 may be depicted within a cut-away view 1110, to better depict materials below a top material. Such a cut-away view or combination or combinations of layers is not meant to restrict a size of any one material or layer with respect any other, and a variety of thicknesses of such materials and/or layers are possible.

Figure 12:
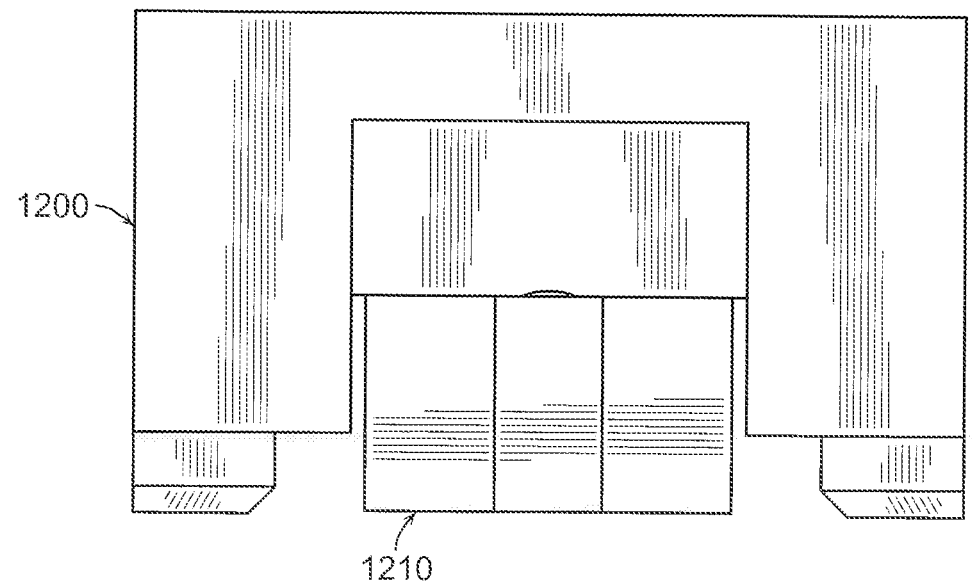
FIG. 12 depicts an exemplary diagram according to embodiments of the invention.

FIG. 12 depicts an exemplary embodiment of the invention. A component 1210, e.g., an LTCC RF filter component, an LTCC filter device, an LTCC passive component, or other surface mount component, may be surrounded by a shield 1200. Shield 1200 may be attached to LTCC filter device 1210 before, during or after attachment to, for example, a PCB. A combination of component 1210 and shield 1200 may be suitable for assembly or construction onto a PCB or other circuit. A ground connection of an electrical circuit within surface mount component 12010 may be electrically, mechanically and/or operably electrically connected to shield 1200. Shield 1200 may be attached and/or assembled onto a PCB and shield 1200 may be electrically, mechanically and/or operably electrically connected and/or attached to a ground plane and/or an electrical circuit ground connection on a PCB onto which it may be attached. Shield 1200 may fit snugly around component 1210, or there may be gaps and/or cavities between them.

Figure 13:
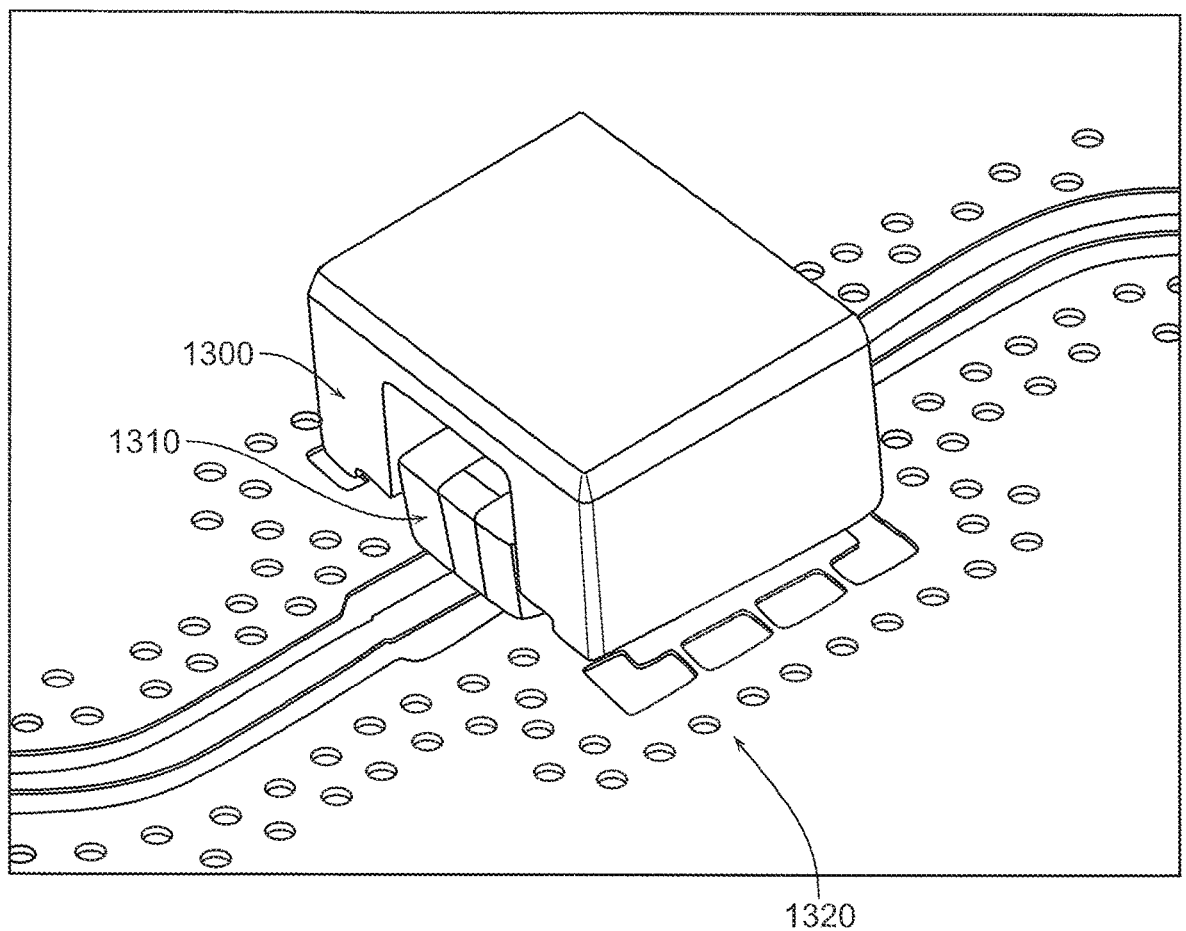
FIG. 13 depicts an exemplary diagram according to embodiments of the invention.

FIG. 13 depicts an exemplary embodiment of the invention. A surface mount component 1310, for example an LTCC RF filter component, may be surrounded by a shield 1300, and may be attached to a PCB 1320. Attachment may be made at a circuit input connection, or lead, an output lead and/or at a ground connection. A ground connection may be between shield 1300 and electrical ground features of PCB 1320. Electrical ground features of PCB 1320 may be a ground plane, ground and/or attachment pins, leads or tabs, other attachment features, or any combination of such features. PCB 1320 may have a continuous ground plane, a ground plane with via holes, and/or other ground features. By attaching shield 1300 around component 1310, an electrical ground potential may be created and/or maintained around such a component 1310. Such an electrical ground potential that may be around a component 1310, for example around at least three sides of component 1310, may have Faraday isolation electrical properties and may provide improved isolation of a circuit on or within component 1310. Such an electrical ground potential may be operable to have an effect of component 1310 being within an electrically shielded enclosure, for example as may be created when a component may be placed inside a closed metallic box or enclosure with a grounded electrical potential of such enclosure, and thus may benefit from improved electrical performance of such effected enclosure.

Figure 14:
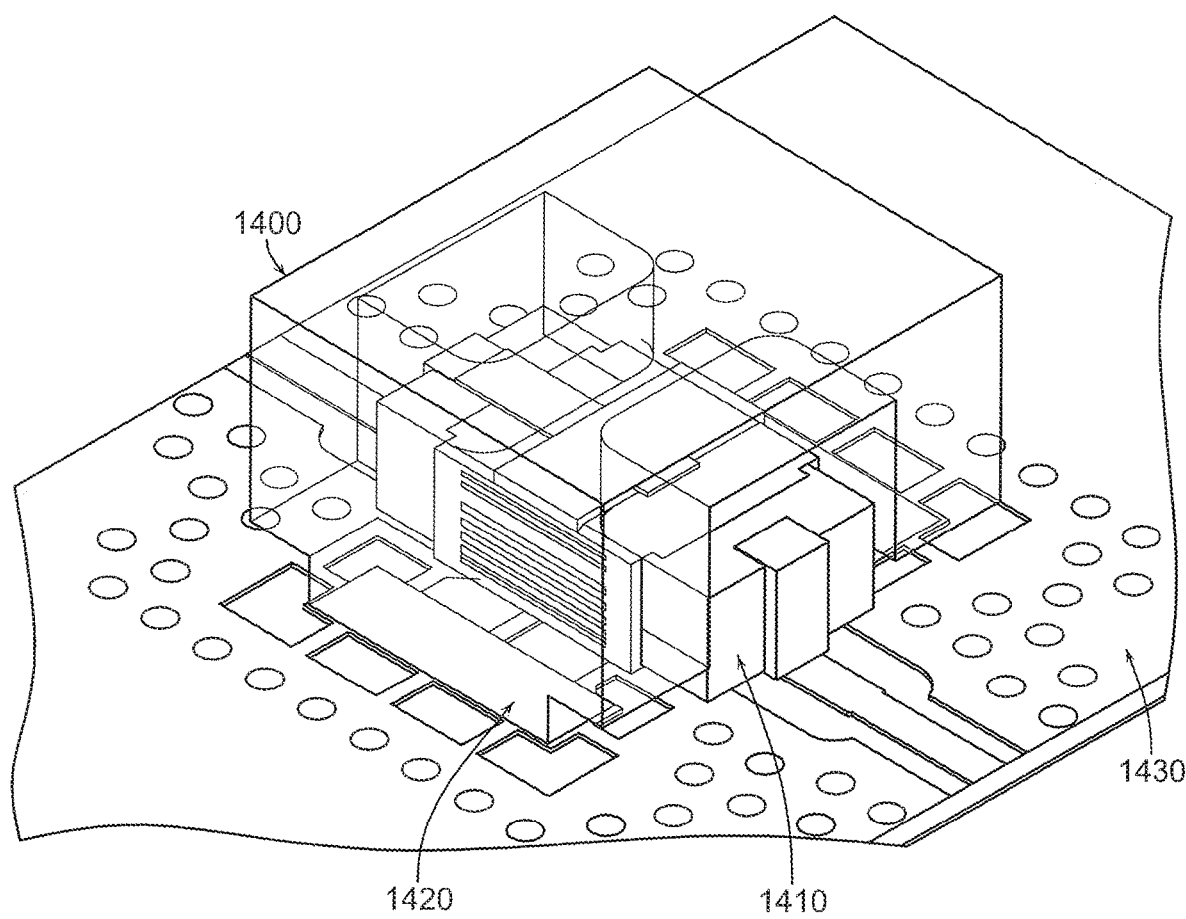
FIG. 14 depicts an exemplary diagram according to embodiments of the invention.

FIG. 14 depicts an exemplary embodiment of the invention. An isometric view of a device 1410, e.g., an LTCC device, with an external shield 1400 is shown, with elements of FIG. 14 shown with transparency for visual clarity of the figure. Internal and external grounding structures, as depicted by other figures, may be visible in such an exemplary embodiment. Grounding from shield 1400 to a PCB may be by attachment to a ground connection 1420 on PCB 1430.

Figure 15:
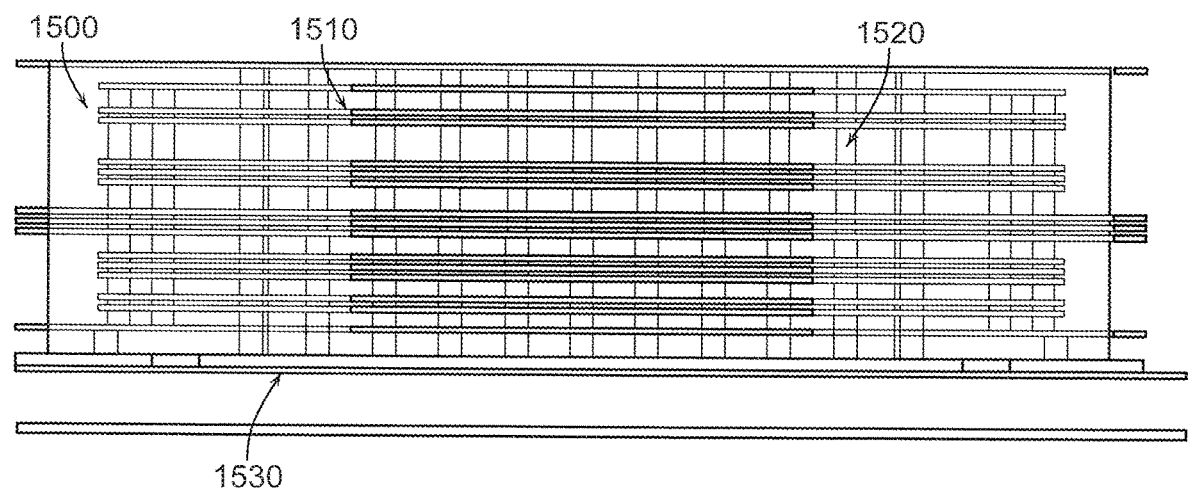
FIG. 15 depicts an exemplary diagram according to embodiments of the invention.

FIG. 15 depicts an exemplary embodiment of the invention. A side view of a device, e.g., an LTCC device, surrounded by a shield 1500 is depicted. An internal grounding structure, e.g. a grounding cage, may be comprised of horizontal shielding elements 1510, vertical shielding elements 1520, or a combination of one or more of each such elements. Shielding elements 1510, 1520 may be solid structures, via holes, or any combination of such elements. Shielding elements 1510, 1520 may be electrically, mechanically and/or operably electrically connected. A shield may be attached to a PCB ground at ground plane and/or ground mounting surface 1530. A PCB ground attachment 1530 may be referred to as being below, or vertically below, a device, for example for purposes of relative description of orientations. A ground mounting or attachment surface may be smooth and/or flat, and may extend throughout all of a bottom side of a component enclosed within shield 1500. A ground mounting or attachment surface may be solid, or may have an aperature, and such an aperature may be for a separate mounting of an enclosed device, e.g., an LTCC circuit or filter device.

Figure 16A:
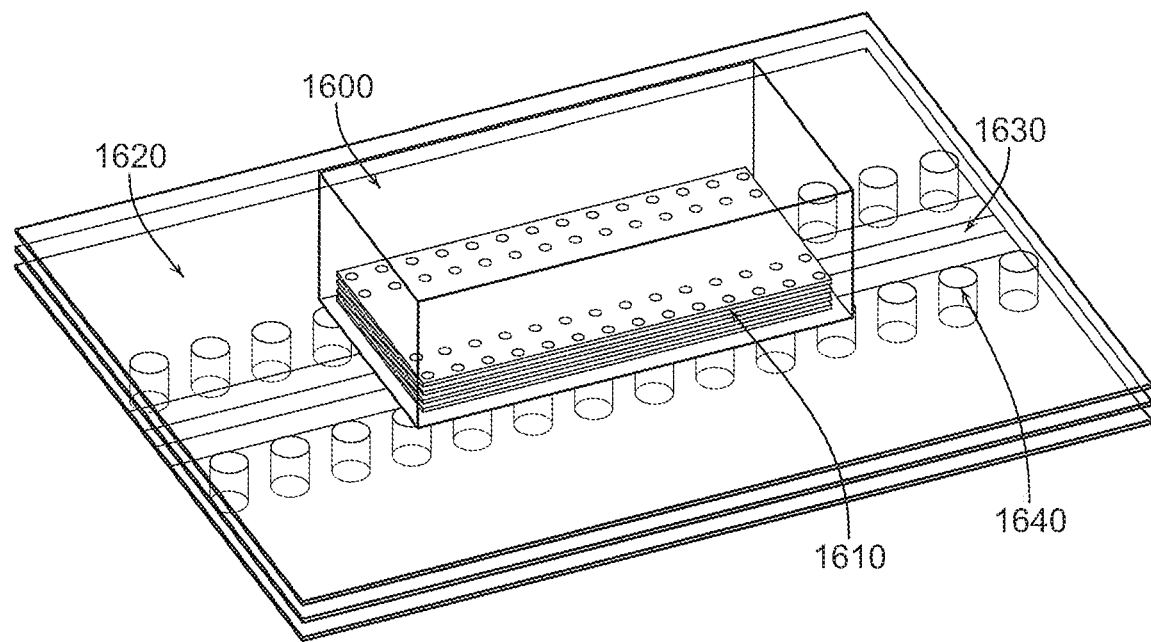
FIGS. 16a and 16b depict exemplary diagrams according to embodiments of the invention.
Figure 16B:
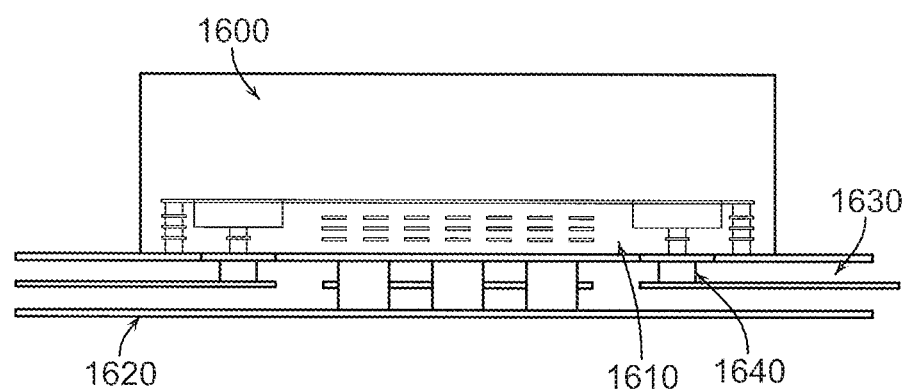

FIGS. 16*a* and 16*b* depict views of exemplary embodiments of the invention. A shield 1600 may surround an LTCC device 1610, e.g. an LTCC filter. Such shield 1600 and LTCC filter 1610 may be attached to a PCB 1620. PCB 1620 may be constructed and/or manufactured to support a transmission line, e.g., a stripline, microstrip, etc., electrical RF transmission structure having transmission lines 1630 that may not be exposed outside such a structure. Electrically conductive structures 1640, e.g. metallic vertical vias, may be formed within a top layer of stripline PCB 1620 to facilitate an electrically operable and/or conductive connection between transmission lines 1630, e.g. input and/or output transmission lines, and input and/or output connections, e.g. terminals, leads, ports, etc., of LTCC circuit 1610. Other vias 1640 may be used to electrically operable and/or conductively connect, for example, a top ground plane stripline ground conductor of stripline 1620 to a bottom stripline ground conductor of stripline 1620, and/or to grounding features of a shield of LTCC component 1600.

Figure 17:
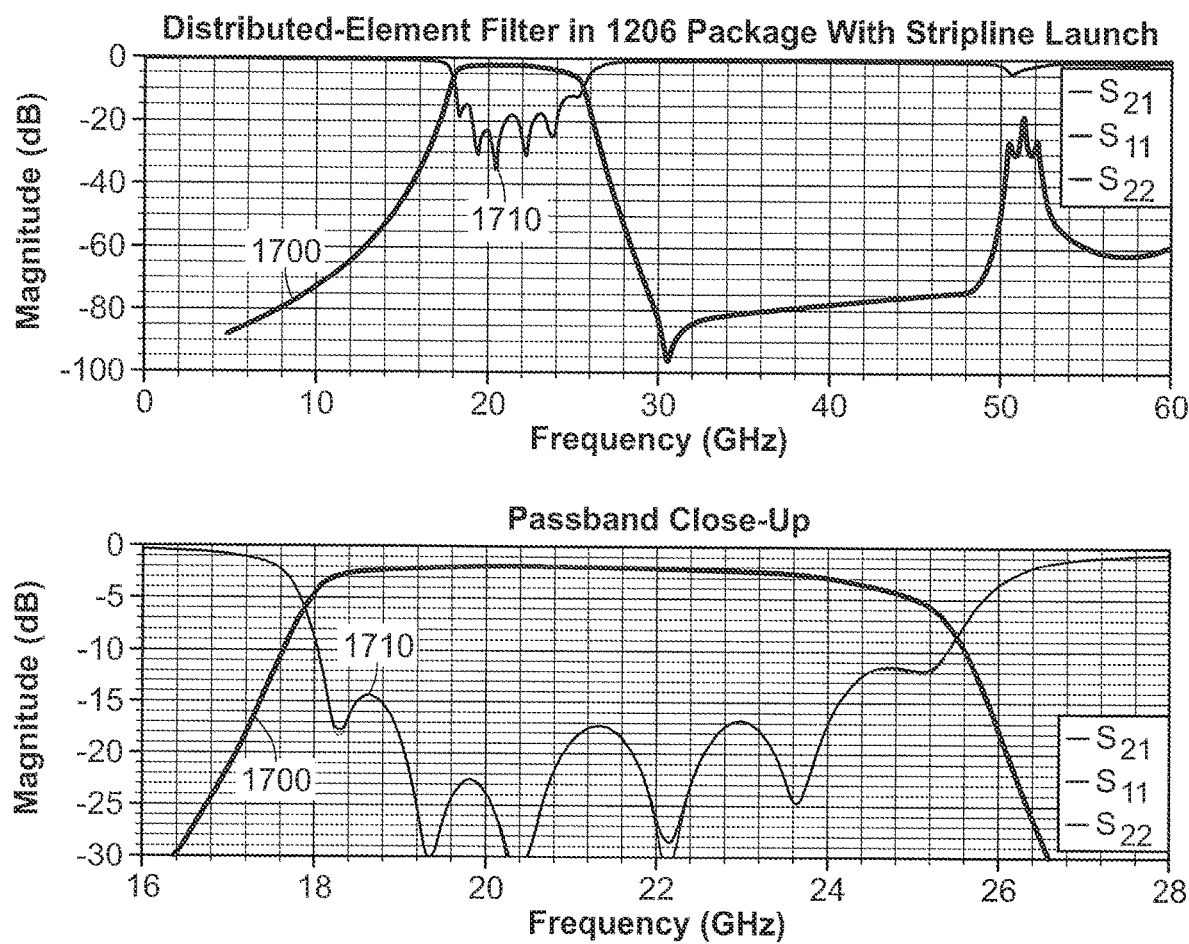
FIG. 17 depicts an exemplary diagram according to embodiments of the invention.

According to an exemplary embodiment of the invention, an LTCC filter may be constructed and mechanically attached to a PCB, and electrical operable connections may be made to allow measurement of an LTCC filter device. FIG. 17 shows an exemplary electrical performance result of such a measurement, depicting a same result both over a broad frequency range and over a narrow frequency range. Such a narrow frequency range may be a sub-set of a broad frequency range, and may be around and/or encompass, for example, a passband of an LTCC filter device constructed according to embodiments of the invention. A response of RF electrical energy transiting, or passing, through such an LTCC filter is depicted 1700, and may show minimal or no degradation of a passband signal 1700, for example, as a result of implementing and/or attachment of a shield in accordance with embodiments of the invention. A return loss, or reflection response, 1710 is depicted showing reduced reflections within a desired design passband and high reflections throughout a desired design stopband. High reflections may be an indication of a stopband performing as designed and/or as intended, where an increase in reflections in a stopband may be, for example, an indication of an improvement in a functioning of a filter. Such exemplary performance may be from, for example, an LTCC filter with a shield grounded to a stripline PCB, fully enclosing such device excepting only input and output ports, and may have internal vias and/or additional internal grounded shielding structures. Such electrical characteristics may be characterized as a filter with good, or improved, performance. Such a device according to embodiments of the invention represent improvements over other technologies and depicts clear performance advantages.

Figure 18:
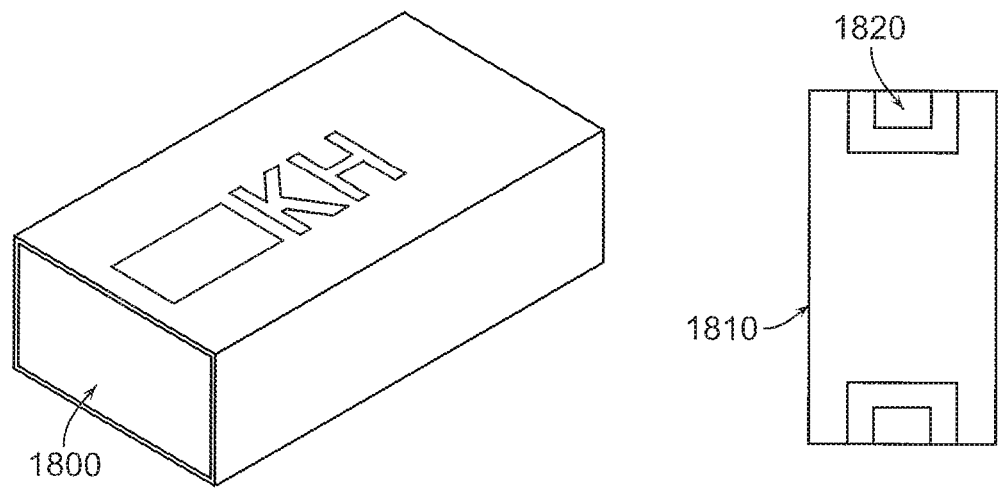
FIG. 18 depicts an exemplary diagram according to embodiments of the invention.

FIG. 18 depicts an exemplary embodiment of the invention. A shielded case 1800 of a device, e.g. an LTCC filter device, may have ports, or electrical signal launches, 1820 for attachment and use with a co-planar waveguide (CPW) and/or a microstrip PCB. Grounding of such a device 1800 may be by ground attachment 1810, electrically operably connected to a shield of device 1800. An exemplary device as depicted in FIG. 18 may have a shielding structure on four sides, where a fourth side with ground attachment 1810 may have aperatures for transfer of electrical signal energy between an interior and an exterior of case 1800 that may be located coplanar with a surface for attachment to a PCB.

Figure 19:
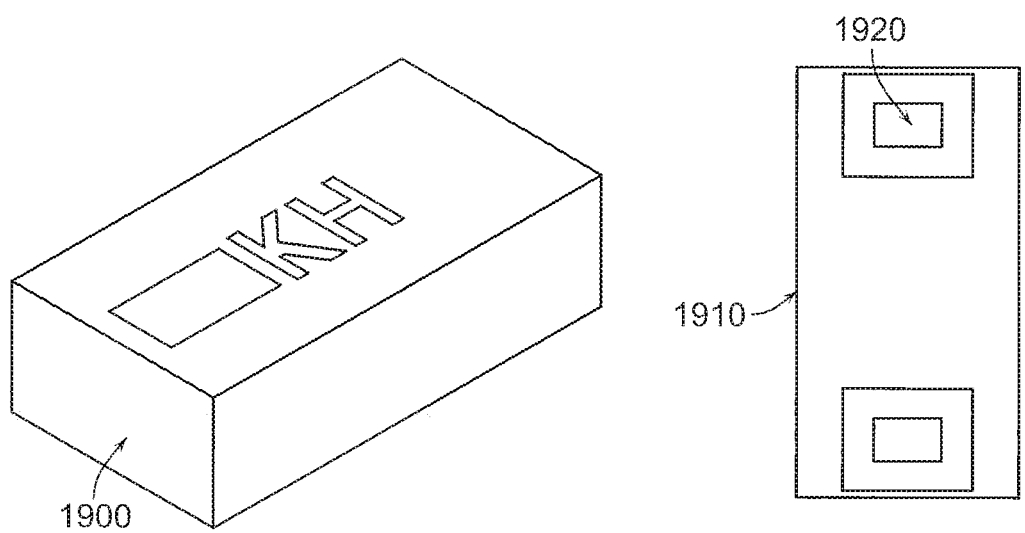
FIG. 19 depicts an exemplary diagram according to embodiments of the invention.

FIG. 19 depicts an exemplary embodiment of the invention. A shielded case 1900 of a device, e.g. an LTCC filter device, may have ports, or electrical signal launches, 1920 for attachment and use with a stripline PCB. Grounding of such a device 1900 may be by ground attachment 1910, electrically operably connected to a shield of device 1900. An exemplary device as depicted in FIG. 19 may have a shielding structure on six sides, where a fourth side with ground attachment 1910 may have aperatures for transfer of electrical signal energy between an interior and an exterior of case 1900 that may be located coplanar with a surface for attachment to a PCB.

Figure 20:
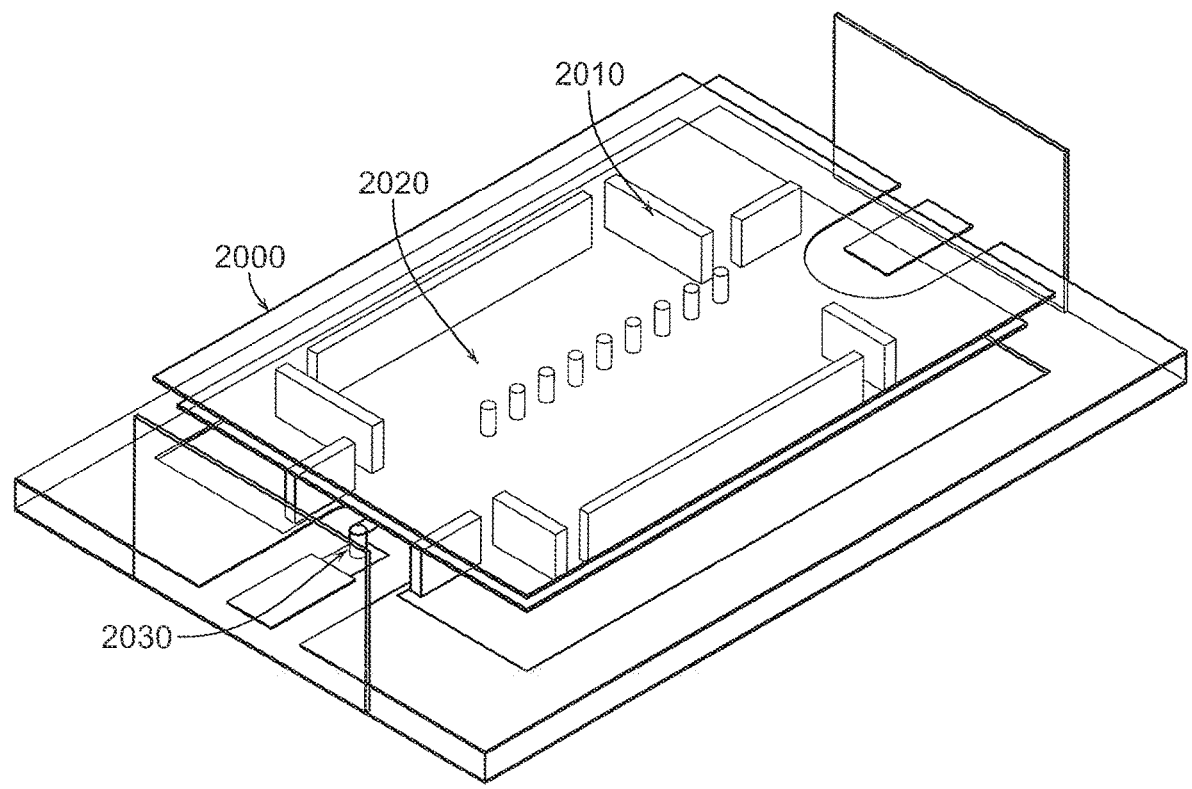
FIG. 20 depicts an exemplary diagram according to embodiments of the invention.

FIG. 20 depicts an exemplary embodiment of the invention. A shield 2000 of a device, e.g. an LTCC filter device 2020, or other circuit 2020, may be used to improve performance of such a filter device, and may be internal, e.g. mechanically embedded within, external, e.g. exposed to an environment around such a device, or a combination of both. A shield may be comprised of horizontal elements 2000, vertical elements 2010, e.g. walls, via holes, etc., or a combination of such elements, and may be electrically conductive, e.g. comprising an electrical signal energy transmission ground or electromagnetic ground or signal ground reference. Horizontal elements 2000, vertical elements 2010, e.g. walls, via holes, etc., or a combination of such elements may be electrically, mechanically and/or electrically operably connected. A shield may be mechanically, operably and/or electrically connected to a signal ground of a device within such a shield. Such a shield 2000 may be comprised of one or more layers, and such layers may be electrically operably and/or mechanically connected. A ground connection to and/or on a PCB may also be such a layer. For positional reference, horizontal may refer to a plane parallel to a mounting surface plane, or a plane of a top surface of a PCB onto which such an exemplary device may be mounted. Also, for positional reference, vertical may refer to a plane perpendicular to a mounting surface plane, or a plane of a top surface of a PCB onto which such an exemplary device may be mounted. Vertical elements 2010 may be solid rectangular, solid cylindrical, or any other suitable solid geometric shape. Electrical signal energy may flow into and/or out of such an LTCC filter 2020 via one or more electrically operable connections to a PCB 2030, for example, onto which such a circuit 2020 and its associated shield 2000 may be mounted, at input and/or output signal connections, e.g. leads, ports, terminals, etc., and may be through an aperature, for example an aperature in a shield. Electrically conductive layers may be embedded within an LTCC structure, or may be exposed. In some embodiments, such a shielding structure may employ features, e.g., full tape thickness features, and such features may provide optimal electrical grounding and/or high electrical signal energy, e.g. RF signal, AC signal, etc., isolation, for example, from an input port to an output port of such a device. Some devices may be bi-directional, and input ports and output ports may be interchangeable.

Figure 21:
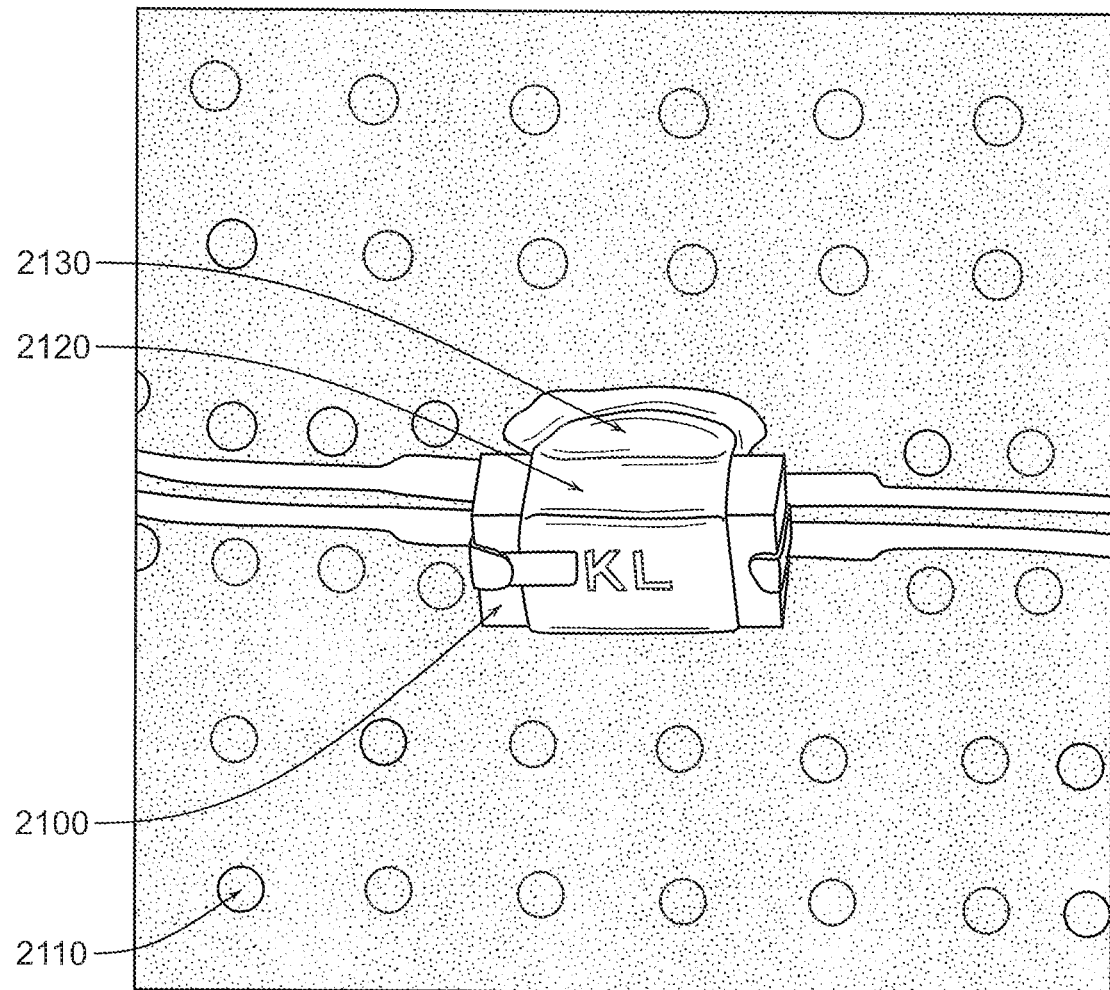
FIG. 21 depicts an exemplary diagram according to embodiments of the invention.

FIG. 21 depicts an exemplary embodiment of the invention. An LTCC filter device 2100 may be attached to a PCB 2110 according to embodiments of the invention, and may have a wrap-around ground structure 2120. Such a wrap-around ground structure of LTCC device 2100, e.g. an LTCC filter, may be attached to a ground 2130 of PCB 2110. An exemplary embodiment may be a grounding structure 2120 that may surround a device 2100, e.g., an LTCC device, a surface mount device, etc., that may be formed by application of a viscous substance 2120, 2130 having metallic properties, e.g., an epoxy with a metallic element content. For example, such a substance may be a silver loaded epoxy, or silver epoxy. Curing may be a process whereby such a viscous substance may become hardened, and may become attached and/or bonded 2130 to any surface, e.g., a PCB 2110, a device 2100, on which it may be in contact. Such a substance may be applied by brushing onto and around, for example, an LTCC device 2100, by mechanical application, either manually, automated, or a combination thereof. Such a substance may be applied such that it is in contact with a ground plane, for example of a PCB 2110, that a device may be mounted upon. For example, a silver loaded epoxy 2120, 2130 may be applied around at least three sides of an LTCC device 2100, or LTCC filter 2100, having, for example, a rectangular prism shape, and may extend 2130 beyond at least one of such sides 2120 onto a PCB 2110 onto which an LTCC device 2100 may be mounted to be in contact with a ground plane of a PCB 2110, thus providing an electrical and/or electrically operable contact with such ground plane. In some embodiments, such a silver epoxy 2120, 2130 may not be in direct physical contact with a ground plane 2110, and may be in electrically operable contact with a ground plane 2100, for example by electrical signal coupling. In some embodiments, a silver epoxy 2120, 2130 may be in direct physical and/or electrical contact 2130 with grounding elements, signal ground points and/or other circuit ground points of an enclosed, or partially enclosed, circuit or device 2100, e.g., an LTCC circuit or device. In other embodiments, a silver epoxy 2120, 2130 may be applied so as to be substantially physically close to such grounding elements, signal ground points and/or other circuit ground points of an enclosed, or partially enclosed, circuit or device 2100, without having intimate direct physical and/or mechanical contact, and may have an operable electrical connection, for example by electrical signal coupling, by a Faraday shielding effect, or other similar electrical signal coupling and/or connection effects. In an embodiment, conformal coating may refer to a process of coating an LTCC monolithic structure 2100 with a conductive paste 2120, 2130 that may conform to its external surface and contours, and may provide a structure with a continuous external electrical shielding 2120, 2130. Electrical signal inputs and/or outputs, for example that may be attached to a transmission line, may not be electrically, mechanically and/or electrically operably connected to, for example, a conductive paste 2120, 2130.

Figure 22:
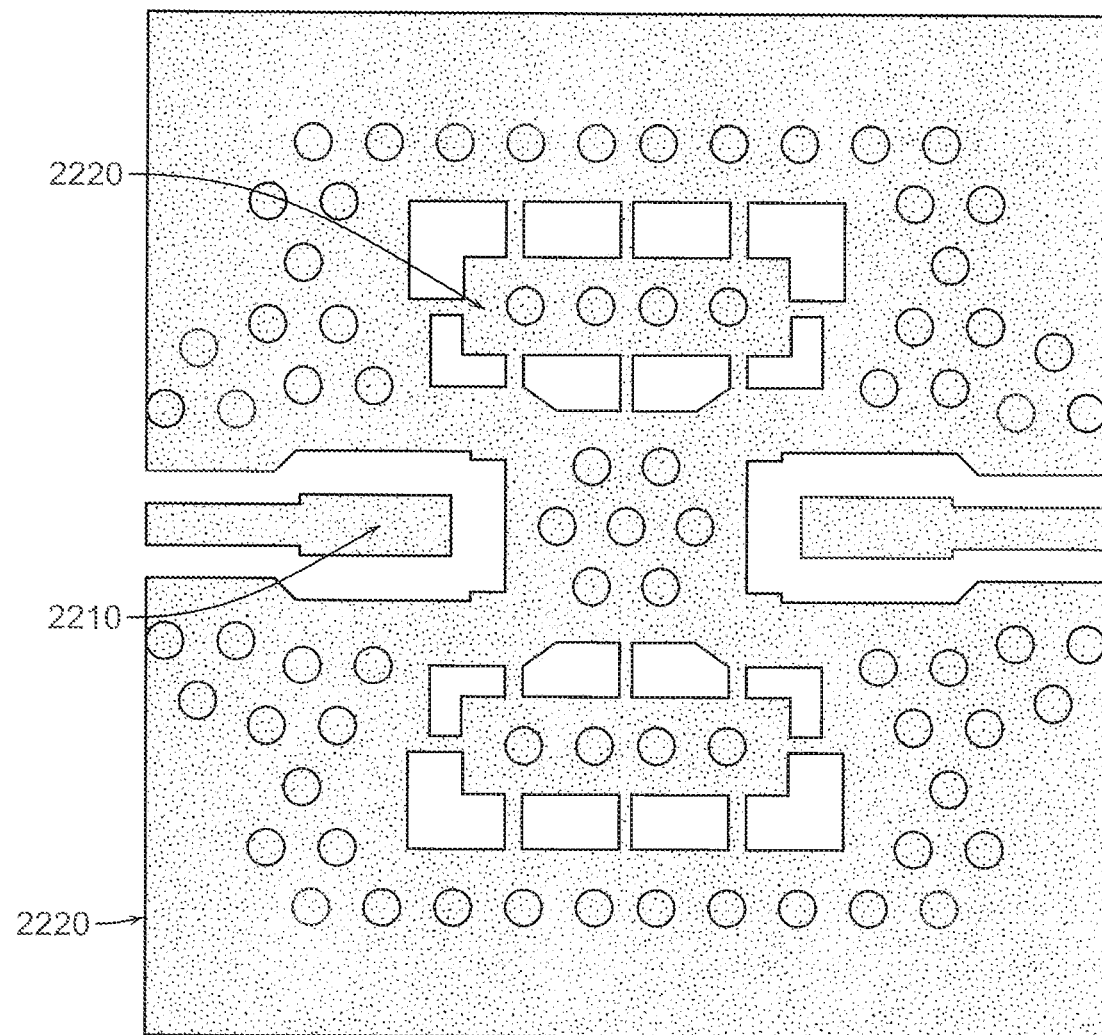
FIG. 22 depicts an exemplary diagram according to embodiments of the invention.

FIG. 22 depicts an exemplary embodiment of the invention. A PCB 2200 may be used for mounting, attachment, connection and/or use of devices according to embodiments of the invention. PCB 2200 may have one or more port connections 2210 and one or more electrical ground connections 2220. Ground connections 2220 may be ground plane cut-outs, and may constrain a position of leads, e.g. leads or legs of a filter, during a solder process, e.g. reflow soldering. Port connections 2210, e.g. traces, may be thin traces, and may provide surface tension that may prevent outflow of solder, for example, without a use of a solder mask, increasing efficiency and lowering cost of assembly. Port connections 2210 may be transmission lines, and may carry and/or conduct electrical signals that may be input signals and/or output signals, and may transition between an exterior of a shielding structure and an interior of a shielding structure. Ground connections 2220 may be stepped leg, e.g. a stepped leg cross section, may reduce an amount of solder needed to mount a shield to a PCB 2200, and may reduce a tendency of such a shield to move, or float, during an assembly process, e.g. reflow soldering. In some embodiments, thin lines may not be necessary. In other embodiments, a PCB 2200 may be fabricated with, for example, a full cut-out around a shield leg landing pad on such a PCB 2200, and electrically conductive ground vias that may be beneath such legs and/or ground contact may make electrical contact through a device's wrap-around, e.g. wrap-around shield. PCB 2200 may form a fourth side of an electrical shielding structure, according to embodiments of the invention.

Figure 23:
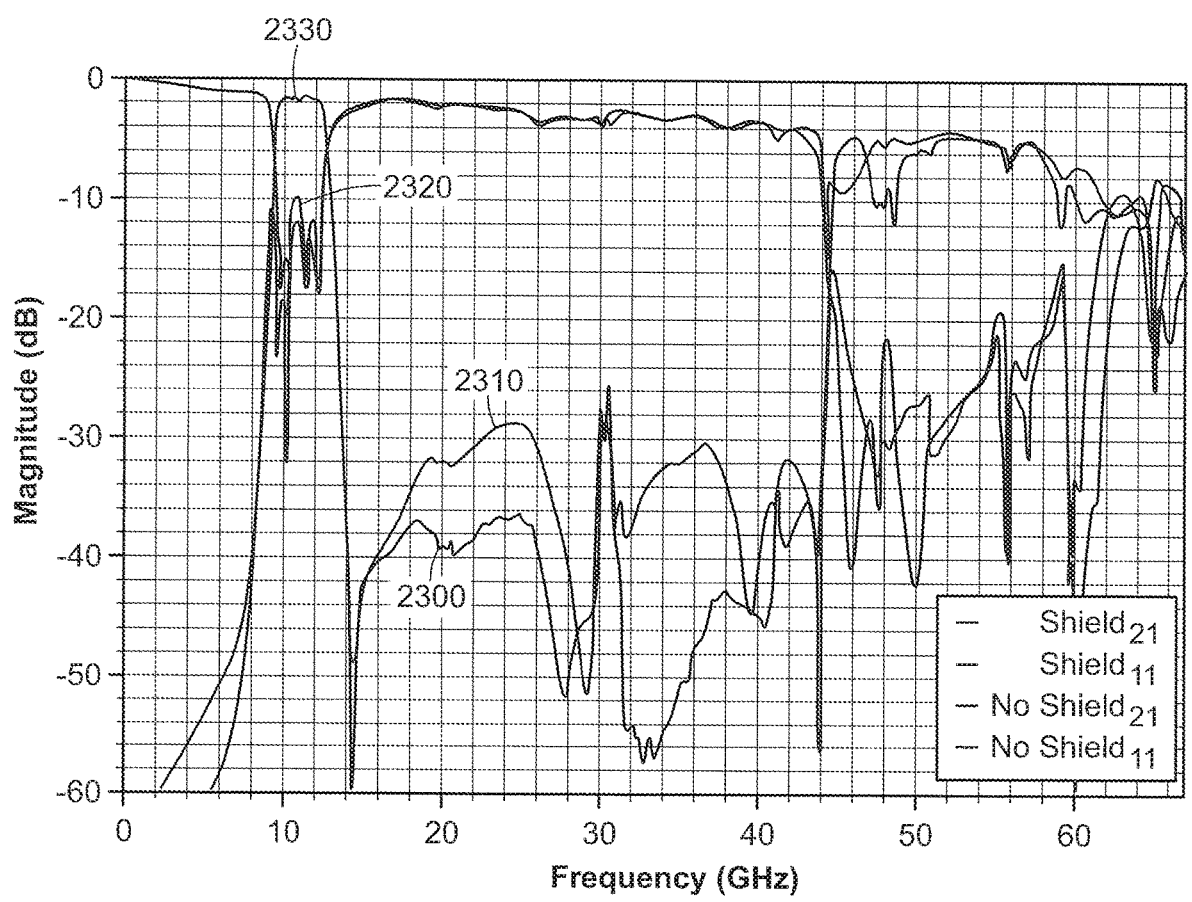
FIG. 23 depicts an exemplary diagram according to embodiments and FIG. 24 depicts an exemplary diagram according to methods of the invention.

According to an exemplary embodiment of the invention, an LTCC filter may be constructed and mechanically attached to a PCB, and electrically operable connections may be made to allow measurement of an LTCC filter device. FIG. 23 shows an exemplary electrical performance result of such a measurement. An LTCC filter device may be constructed, and a shielding structure according to embodiments of the invention may be attached according to further embodiments of the invention. It may then be mechanically attached to a PCB, and after attachment, electrical operable connections may be made to allow measurement of a shielded LTCC filter device. According to exemplary FIG. 23, performance within a passband frequency band 2330 may have no deviation or degradation in performance between a shielded or an unshielded LTCC filter, which may be a desired result. A shielded LTCC filter rejection performance 2300 has an increase in an electrical signal rejection in substantially all of a rejection band frequency band when compared to an unshielded LTCC filter performance 2310, which is an additional desired result. An increase in rejection may be, for example 20 decibels (dB), or another amount of increase of undesired electrical frequency signals.

Also depicted by exemplary FIG. 23 may be a measure of reflected signal 2320, which may be proportional to a mismatch experienced by an electrical signal when entering a device or structure, e.g. an LTCC filter. A measurement of a reflected signal 2320, S11, may be shown for both an LTCC filter without a shield and an LTCC filter with a shield constructed and installed according to embodiments of the invention. This exemplary measurement may show there may be no significant deviation in electrical performance when a shield may be used, which may be a further desired result.

Exemplary measurements may use, for example, through line de-embedding or other measurement techniques. Measurement techniques may be used to isolate electrical performance of a device under test (DUT), whether a control group device, e.g. an LTCC filter without a shield, a device with a shield constructed and installed according to embodiments of the invention, e.g. an LTCC filter with a shielding structure installed around it, or another device desired to have electrical performance measurements made and/or recorded.

Figure 24:
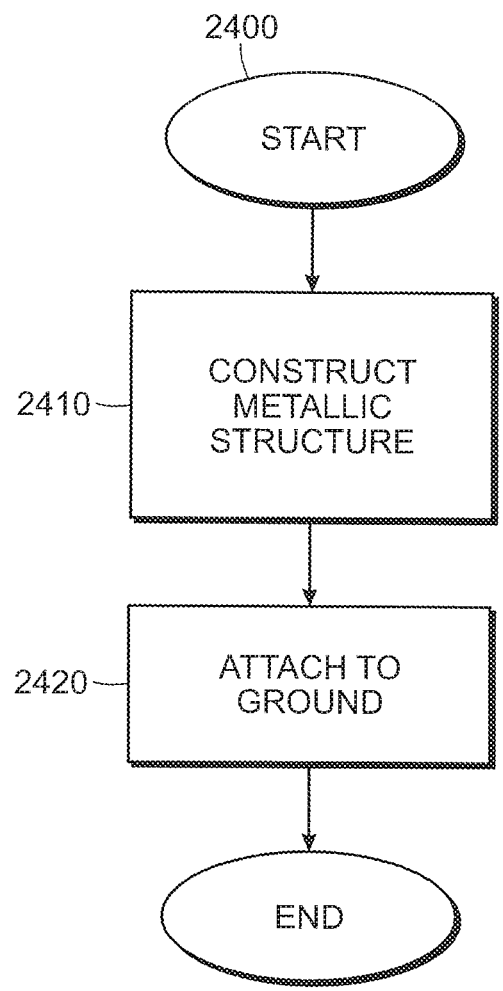

An exemplary method according to embodiments of the invention may be according to FIG. 24. An exemplary embodiment may be a method of shielding a surface mount device, e.g., an LTCC filter, an LTCC coupler, an LTCC power divider and/or combiner, or other LTCC devices and/or circuits. A method 2400 may start and may be to select a shield material having a metallic composition, another material having a metallic coating, another material having properties such that it may act as an electrical wall or shield, or a combination of such materials. Using such materials, a metallic structure, for example a shield or metallic shield, may be constructed 2410. Such structure may be a three dimensional rectangular structure, for example a rectangular prism, or another solid structure that may be constructed to enclose, at least partially, a surface mount electrical device, e.g., an LTCC device, for mounting on a PCB, for mounting into a hybrid electrical circuit, or for inclusion, construction and/or assembly into other microelectronic circuits, components and/or systems. Such a structure may be a viscous material, e.g., a silver epoxy, that may be cured after application to, for example, harden such a material. Construction of a metallic structure 2410 may be, for example, by manufacturing a metallic rectangular prism into a shape that may extend to be around an LTCC surface mount electrical device or component, and may have aperatures allowing passage of electrical signals, e.g., other than an electrical ground or ground signal, between an enclosed circuit and an external circuit, e.g., a circuit on a PCB, onto which such an LTCC device may be mounted. Construction of a metallic structure 2410 may be, for example, by applying a substance, e.g., a paste having a metallic content, an epoxy having a metallic content, or other such substance having metallic electrical properties, around at least three sides of a surface mount electrical device, e.g., an LTCC circuit or device, and each side may be fully or partially covered. Application of such a substance may be performed, for example, following attachment of a surface mount device to a PCB. Application may include physical application and/or attachment to an LTCC device and/or a PCB, and may include curing and/or hardening of such a substance, for example, into a conformed shape, and may be referred to as conformal coating, for example conformal coating of a silver epoxy around a surface mounted LTCC circuit or device.

A metallic structure that may be constructed 2410, and such a structure may be attached to ground 2420. Such attachment to ground may be by physical attachment, mechanical attachment, operable electrical attachment, e.g., electrical coupling, or any other suitable attachment method or combination of methods. A metallic structure may be attached to a ground plane and/or ground electrical contacts, on a PCB or other circuit or element onto which it may be assembled. A metallic structure may be attached, by, for example, direct physical and/or electrical contact, by operable electrical contact, by electrical signal coupling, or other electrical signal continuity attachment, to grounding elements, signal ground points and/or other circuit ground points of, for example, an enclosed, or partially enclosed, circuit or device, e.g., an LTCC circuit or device. A metallic shield structure may be attached to both a ground plane on a PCB and to a circuit ground of an enclosed circuit. In an embodiment a metallic shield may be attached to a PCB ground and an enclosed LTCC device or an LTCC circuit ground and may form an electrically continuous ground shield around such an enclosed LTCC device, that may, for example, increase and/or improve isolation from an external circuit and/or environment, and may improve an intended operation and/or intended function of enclosed device.

In an embodiment, conformal coating may refer to a process of coating a surface mount device, for example an LTCC circuit, an LTCC device and/or an LTCC monolithic structure, with a conductive paste that may conform to an external surface of such device or monolithic structure, may contour, and may provide a structure with a continuous external electrical shielding, either by physical continuous wrapping and/or electrical coupling wrapping.

Exemplary embodiments may include an apparatus for shielding that may comprise a metallic structure that may have continuous metal around its circumference, an attachment of one or more metallic structures to one or more metallic attachment points of a device, e.g., an LTCC device, that may be enclosed by a metallic structure, two or more apertures that may not have shield metallization extending from an interior to an exterior of a metallic structure, and one or more geometric features of a metallic structure that may be for attachment to metallic elements of an external circuit, for example, on a printed circuit board. An apparatus may be constructed of a material other than metal and a metal may be plated onto one or more surfaces of a structure. Plated metal may be both on an exterior and on an interior of a metallic structure. Apertures may include one or more metallic elements extending from an interior to an exterior of a structure and may be electrically disconnected from a continuous metal shield, each may be individually electrically connected to distinct metallic attachment points of an enclosed device. An enclosed device may be selected from a low temperature co-fired ceramic (LTCC) electrical device, a low temperature co-fired ceramic (LTCC) electrical circuit or a low temperature co-fired ceramic (LTCC) electrical filter, or a combination of such circuits and/or devices.

In some exemplary embodiments an enclosed device may be a filter, for example an electrical signal energy filter for passing through one or more bands of frequencies, e.g., pass band, and rejecting, or preventing from passing through, one or more bands of frequencies, e.g., reject bands or rejection bands, from an input to an output. An enclosed device may be an LTCC filter that may have a metallic structure and may reject additional electrical signal energy passing through from an input port to an output port throughout substantially all of its design stopband frequencies, where additional rejected electrical signal energy may be attributable to an electrically connected metallic shielding structure. An LTCC filter may have a metallic structure and may pass substantially the same electrical signal energy passing through from an input port to an output port throughout substantially all of its design passband frequencies, where passed electrical signal energy may have substantially no additional insertion loss from the electrical connection, addition and/or operable connection of a shielding structure, for example versus a device having no shielding structure. Metallic attachment points of a device enclosed by a metallic structure may be electrically connected to electrical grounding structures that may be within an electrical circuit of an LTCC device, an LTCC circuit and/or an LTCC filter.

In some exemplary embodiments one or more geometric features may be a flat and smooth surface that may be a co-planar surface to a printed circuit board, for example when attached to a printed circuit board. An attachment may be made by, for example, reflow soldering. One or more flat and/or smooth geometric features may facilitate self-alignment, for example, during reflow soldering, and may occur when a structure may be mechanically attached to a printed circuit board that may have one or more metallic features that may be geometrically matching a shape of a metallic structure. A printed circuit board may have metallic features that may include one or more of ground plane metallic relief, thin metallic electrical conductor attachments and/or a stepped leg cross-section, or any combination thereof. A geometric feature may be one or more solder cups that may be within, for example, the outer envelope of a metallic structure. A solder cup may contain solder paste, other solder and/or other attachment material during attachment, may contain excess solder and/or work to contain from overflow excess solder, and wick excess solder into a solder cup when solder may be in a molten state, to operably maintain a subsequently cooled solder fillet into a substantially thin attachment structure.

In some exemplary embodiments a metallic structure may be manufactured in bulk, for example, two or more at a time on a co-located workpiece, for example a workpiece of a large enough single piece size of raw material to provide for manufacture of two or more shield structures. A workpiece may be milled, machined and/or undergo another shaping process during a manufacturing process to shape a metallic structure that may simultaneously maintain a substantially constant geometric orientation relative to the geometric axes of the mill or machine. A workpiece may be diced or finished, for example, with additional manufacturing processes that may be subsequent to milling or machining, or such other shaping or forming.

An exemplary embodiment may be an apparatus for shielding a low temperature co-fired ceramic (LTCC) component that may comprise at least a metallic structure that may have continuous metal around its circumference, an attachment of a metallic structure to metallic attachment points of a device that may be enclosed by a metallic structure, two or more apertures that may have relieved metallization that may extend from an interior to an exterior of a metallic structure that may contain metallic electrical signal input and output terminal ports that may be electrically connected to corresponding input and output ports of an enclosed LTCC circuit, and may be electrically isolated from an enclosed metallic structure, one or more cavities that may be positioned to be vertically on top of terminal ports to operably reduce electrical capacitance of such terminal ports, and a smooth and/or flat surface of a metallic structure and a solder cup within a metallic structure for attachment to metallic elements on a printed circuit board. There may additionally be one or more additional metallic structures internal to an exterior of the an LTCC component at least partially enclosing a device, and may be electrically connected to a metallic structure.

Embodiments of the invention may include one or more methods for manufacturing apparatuses, items, systems, devices and/or combinations thereof of the invention.

An exemplary embodiment of the invention may be an apparatus for shielding that may comprise a metallic structure or a metallic frame structure, that may have continuous metal around its circumference, and may have at least one radial side extending to a flat coplanar surface, where a radial side may be solid or may have one or more open first aperatures to an interior. There may be an attachment of such a metallic structure to metallic attachment points of a device that may be enclosed by a metallic structure, and may have two or more second apertures each that may have relief of a continuous metallization that may extend from an interior to an exterior of a metallic structure, and may have one or more geometric features of a metallic structure that may be for attachment to metallic elements, for example, on a printed circuit board.

An exemplary embodiment may be constructed of a non-conductive material that may be other than metal and may have a continuous metal plated, deposited, or attached onto the surface of a structure. A plated or deposited metal may be on both exterior surfaces and/or on interior surfaces of a metallic or metal plated structure. An exemplary embodiment may include one or more metallic elements that may extend from an interior to an exterior of such a structure and may be electrically disconnected from a continuous metal around such a structure, where each may be individually electrically connected to distinct metallic attachment points of an enclosed device, for example an LTCC electrical device, an LTCC electrical circuit or an LTCC electrical filter. ic (LTCC) electrical filter. Such a device may be a filter or an electrical filter that may have frequency passband and frequency reject band properties.

An exemplary embodiment may contain an enclosed device that may be an LTCC electrical filter, where a continuous metallic structure may be operable in conjunction with an enclosed LTCC filter to reject additional electrical signal energy directed to passing through a first input aperature from an input port, through an enclosed LTCC filter, and subsequently directed to pass through a second output aperature as an output port throughout substantially all of its the design stopband frequencies of an enclosed LTCC filter, where additional rejected electrical signal energy may be attributable to an electrically connected metallic shielding structure, and where electrical signal energy passing through from a first input aperature, through an enclosed LTCC filter and through a second output aperature throughout substantially all of the design passband frequencies of an enclosed LTCC filter may experience substantially no additional insertion loss attributable to additional of a continuous metallic structure, for example versus an apparatus without such a shielding structure.

An exemplary embodiment may comprise metallic attachment points of a device that may be enclosed by a metallic structure, e.g. a metallic shielding structure, may be electrically connected to electrical grounding structures within an electrical circuit of an enclosed LTCC electrical device, where such an LTCC circuit may be an LTCC filter. A geometric feature may be a flat and smooth surface that may be a co-planar surface to metallic elements on a printed circuit board, and may be when attached to a printed circuit board that may further be operably connected to a ground plane, e.g. a circuit ground plane from a printed circuit board.

An exemplary embodiment may be an apparatus for shielding a low temperature co-fired ceramic (LTCC) component comprising a metallic rectangular solid structure having continuous metal around its radial circumference, where attachment of a metallic rectangular solid structure may be electrically connected to one or more metallic attachment points of a device enclosed by a metallic rectangular solid structure, and where a metallic rectangular solid structure may have on at least one radial side a smooth and flat surface that may be for mounting to a co-planar ground plane, for example, of a printed circuit board. There may be two or more apertures that may be coplanar to a smooth and flat surface of a metallic rectangular solid structure that may extend from an interior to an exterior of a metallic rectangular solid structure, each may encompass metallic electrical signal input and output terminal ports that may be electrically connected to corresponding input and output ports of an enclosed LTCC electrical circuit, and may be electrically isolated from an enclosed metallic rectangular solid structure An exemplary embodiment may include one or more cavities that may be positioned radially outward from an enclosed LTCC electrical circuit and may be positioned on an opposing side from a smooth and flat surface and may be vertically on top of, or above, terminal ports and may operably reduce electrical capacitance of terminal ports. A smooth and flat surface of a metallic structure and one or more cylindrical volumes of removed metal interior to, and residing within a wall of, a metallic rectangular solid structure may be referred to as a solder cup, and may operate to capture solder flow of a reflow process and may prevent such solder from flowing across an enclosed LTCC electrical circuit or a printed circuit board, and may be within a metallic structure that may be for attachment to metallic elements on a printed circuit board. There may be one or more planar metallic structures that may be internal to an exterior of an enclosed LTCC electrical circuit or LTCC filter or LTCC component, and be at least partially enclosing an LTCC device, and may be electrically connected to a metallic rectangular solid structure, and may be operable as one or more interior ground planes.

An exemplary method according to embodiments of the invention may be for constructing an apparatus that may comprise constructing a rectangular solid structure that may have continuous metal around its radial circumference, may have at least one radial side that may extending to a coplanar flat surface for mounting on a printed circuit board, and may have at least two aperatures along an axis that may be parallel to a longitudinal axis. There may be attached to interior attachment points of a metallic structure metallic attachment points extending from a device, for example an LTCC filter device, that may be enclosed by a rectangular solid structure, or shielding structure. At least two apertures may include one or more metallic elements that may extend from an interior to an exterior of a structure that may be electrically disconnected from a continuous metal, each may be individually electrically connected to distinct metallic attachment points of an enclosed device. Exemplary embodiments may be where an enclosed device may be a low temperature co-fired ceramic (LTCC) electrical filter. There may also be at least one of a metallic attachment point of an enclosed device that may be electrically connected to electrical grounding points of an enclosed LTCC electrical filter. There may be an electrical connection of at least one radial side that may extend to, for example, a coplanar flat surface to a ground plane of a printed circuit board.

An exemplary embodiment may be an apparatus for shielding electrical components that may comprise a metallic rectangular solid frame structure that may have continuous metal around and extending to an edge of at least three sides of its radial circumference, and wrapping around an edge that may be continuous with metal exposed on an interior of a structure, a metallic structure that may have continuous metal around its circumference, and may have at least one radial side that may be defined by edges of adjacent sides that may form walls around a mostly open fourth side, and may be for insertion of electrical components. It may have edges that may be mostly open on a fourth side that may have coplanar solid flat and/or smooth terminations that may be for attachment to metallic elements on a printed circuit board. There may be fifth and sixth sides that may have thick "U" shaped walls, or other shaped walls, that may be open toward a fourth side.

An exemplary embodiment may be where a fourth side may further comprise one or more surfaces that may be for mounting to a co-planar ground plane, for example, of a printed circuit board. It may further comprise one or more solder cups, where a solder cups may be one or more cylindrical volumes of removed metal interior to, and residing within a wall of, a metallic rectangular solid structure, and may operate to capture molten solder that may flow, for example during reflow soldering and/or assembly processes and may operate to prevent solder from flowing across an enclosed electrical component or a printed circuit board that it may be being attached to.

An exemplary embodiment may be where a flat and smooth geometric feature and/or termination may facilitate self-alignment, for example during reflow soldering when a structure may be mechanically attached to a printed circuit board that may have metallic features that may geometrically match a shape of a metallic structure and/or be flat and smooth terminations. A printed circuit board may have metallic features that may include one or more of ground plane metallic relief, thin metallic electrical conductor attachments or a stepped leg cross-section. A metallic structure may be manufactured two or more at a time on a co-located workpiece. A workpiece may be milled or machined during a manufacturing process to shape a metallic structure, for example while maintaining a substantially constant geometric orientation that may be relative to geometric axes of a mill or machine. A workpiece may be diced or finished with additional manufacturing processes subsequent to milling or machining. A metallic frame structure may have a finish or plating applied to its exterior.

An exemplary embodiment may be one or more cavities that may be positioned radially outward from one or more shielded electrical components and may be further positioned on an opposing side from a flat and smooth surface, for example to operably reduce electrical capacitance of input and output electrical signal ports, that may be operating to conduct electrical signal energy. There may be one or more planar metallic structures internal to electrical components, that may, for example, be shielded, and may be electrically connected to a metallic rectangular solid structure, which may be operable as one or more interior ground planes. There may be one or more shielded electrical components that may be an LTCC electrical component, for example, an LTCC filter, and LTCC passive electrical circuit, e.g., a coupler, power divider, etc. or other LTCC electrical circuit.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. An apparatus for shielding electrical components comprising:
    a metallic rectangular solid frame structure having continuous metal around and extending to the edge of at least three sides of its radial circumference, and wrapping around said edge to be continuous with metal exposed on the interior of a structure, and having at least one radial side defined by the said edges of adjacent sides forming walls around a mostly open fourth side, for insertion of said electrical components;
    said edges of said mostly open fourth side having coplanar solid flat and smooth terminations for attachment to metallic elements on a printed circuit board; and
    fifth and sixth sides with thick "U" shaped walls, open toward said fourth side;
    said apparatus further comprising one or more solder cups, where said solder cups are one or more cylindrical volumes of removed metal interior, and residing within a wall of said metallic rectangular solid structure, operating to capture molten solder flow during reflow assembly processes and operating to prevent said solder from flowing across said enclosed electrical component or said printed circuit board.

2. The apparatus of claim 1, wherein said fourth side further comprises one or more surfaces for mounting to a co-planar ground plane of a printed circuit board.

3. The apparatus of claim 1, wherein said flat and smooth termination facilitates self-alignment during reflow soldering when said structure is mechanically attached to said printed circuit board having metallic features geometrically matching the shape of said flat and smooth terminations.

4. The apparatus of claim 3, wherein said printed circuit board metallic features include one or more of ground plane metallic relief, thin metallic electrical conductor attachments or a stepped leg cross-section.

5. A method of manufacturing of the apparatus for shielding electrical components of claim 1, wherein said metallic structure is manufactured two or more at a time on a co-located workpiece.

6. The method of claim 5, wherein said workpiece is milled or machined during a manufacturing process to shape said metallic structure while maintaining a substantially constant geometric orientation relative to the geometric axes of the mill or machine.

7. The method of claim 6, wherein said workpiece is diced or finished with additional manufacturing processes subsequent to said milling or said machining.

8. The apparatus of claim 1, further comprising a finish or plating applied to the exterior of the metallic rectangular solid frame structure.

9. The apparatus of claim 1, further comprising one or more cavities positioned radially outward from said shielded electrical components and further positioned on an opposing side from said flat and smooth surfaces to operably reduce electrical capacitance of input and output electrical signal ports.

10. The apparatus of claim 1, further comprising one or more planar metallic structures internal to said shielded electrical components.

11. The apparatus of claim 10, wherein said planar metallic structures are electrically connected to said metallic rectangular solid structure, operable as one or more interior ground planes.

12. The apparatus of claim 1, wherein said shielded electrical component is a low temperature co-fired ceramic electrical component.

13. An apparatus for shielding electrical components comprising:
a metallic rectangular solid frame structure having continuous metal around and extending to the edge of at least three sides of its radial circumference, and wrapping around said edge to be continuous with metal exposed on the interior of a structure, and having at least one radial side defined by the said edges of adjacent sides forming walls around a mostly open fourth side, for insertion of said electrical components;
said edges of said mostly open fourth side having coplanar solid flat and smooth terminations for attachment to metallic elements on a printed circuit board; and
fifth and sixth sides with thick "U" shaped walls, open toward said fourth side;
said apparatus further comprising one or more cavities positioned radially outward from said shielded electrical components and further positioned on an opposing side from said flat and smooth surfaces to operably reduce electrical capacitance of input and output electrical signal ports.

14. The apparatus of claim 13, wherein said fourth side further comprises one or more surfaces for mounting to a co-planar ground plane of a printed circuit board.

15. The apparatus of claim 13, wherein said flat and smooth termination facilitates self-alignment during reflow soldering when said structure is mechanically attached to said printed circuit board having metallic features geometrically matching the shape of said flat and smooth terminations.

16. The apparatus of claim 15, wherein said printed circuit board metallic features include one or more of ground plane metallic relief, thin metallic electrical conductor attachments or a stepped leg cross-section.

17. A method of manufacturing of the apparatus for shielding electrical components of claim 13, further comprising a finish or plating applied to the exterior of the metallic rectangular solid frame structure wherein said metallic structure is manufactured two or more at a time on a co-located workpiece; and wherein said workpiece is milled or machined during a manufacturing process to shape said metallic structure while maintaining a substantially constant geometric orientation relative to the geometric axes of the mill or machine.

18. The method of claim 17, wherein said workpiece is diced or finished with additional manufacturing processes subsequent to said milling or said machining.

19. The apparatus of claim 13, further comprising one or more planar metallic structures internal to said shielded electrical components, electrically connected to said metallic rectangular solid structure, operable as one or more interior ground planes.

20. The apparatus of claim 13, wherein said shielded electrical component is a low temperature co-fired ceramic electrical component.

* * * * *